US012019131B2

(12) United States Patent
Taki et al.

(10) Patent No.: US 12,019,131 B2
(45) Date of Patent: Jun. 25, 2024

(54) MAGNETIC RESONANCE IMAGING APPARATUS AND IMAGING-TIME SHORTENING METHOD

(71) Applicant: CANON MEDICAL SYSTEMS CORPORATION, Otawara (JP)

(72) Inventors: Sotaro Taki, Utsunomiya (JP); Masao Yui, Otawara (JP); Sadanori Tomiha, Nasushiobara (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/870,996

(22) Filed: Jul. 22, 2022

(65) Prior Publication Data

US 2023/0043460 A1 Feb. 9, 2023

(30) Foreign Application Priority Data

Aug. 4, 2021 (JP) ................................. 2021-128584

(51) Int. Cl.
*G01V 3/00* (2006.01)
*G01R 33/48* (2006.01)
*G01R 33/54* (2006.01)

(52) U.S. Cl.
CPC ....... *G01R 33/543* (2013.01); *G01R 33/4818* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 10,004,422 B2 * 6/2018 Alsop ................ G01R 33/5605
2014/0062473 A1   3/2014 Miyazaki et al.
(Continued)

FOREIGN PATENT DOCUMENTS

CN    106796274 A   * 5/2017 ......... G01R 33/4824
JP    2014-046209 A   3/2014
(Continued)

OTHER PUBLICATIONS

Lee et al., "Optimization of Keyhole Imaging Parameters for Glutamate Chemical Exchange Saturation Transfer MRI at 7.0 T", Molecular Imaging and Biology, Elsevier, Dec. 2019, vol. 22, pp. 924-930, XP037187029.
(Continued)

*Primary Examiner* — Alter L Lindsay, Jr.
(74) *Attorney, Agent, or Firm* — Oblon, McClelland, Maier & Neustadt, L.L.P.

(57) ABSTRACT

A magnetic resonance imaging apparatus includes sequence control circuitry and processing circuitry. In CEST imaging the sequence control circuitry performs a first sequence and a second sequence under different saturation pulse conditions. The first sequence is for acquiring first magnetic resonance signals corresponding to a first frequency region of a k-space and second magnetic resonance signals corresponding to a second frequency region of the k-space. The second sequence is for acquiring third magnetic resonance signals corresponding to at least the first frequency region. The processing circuitry assigns the third magnetic resonance signals and the second magnetic resonance signals to a single k-space generated for the second sequence. Frequency including the first frequency region is lower than frequency including the second frequency region.

13 Claims, 15 Drawing Sheets

(58) Field of Classification Search
USPC .......................................................... 324/300
See application file for complete search history.

(56) References Cited

U.S. PATENT DOCUMENTS

| | | |
|---|---|---|
| 2014/0062476 A1 | 3/2014 | Miyazaki et al. |
| 2014/0361776 A1 | 12/2014 | Miyazaki et al. |
| 2015/0285881 A1* | 10/2015 | Ott .................... G01R 33/5608 324/309 |
| 2018/0313924 A1* | 11/2018 | Zhou ................. G01R 33/4838 |

FOREIGN PATENT DOCUMENTS

| | | | | |
|---|---|---|---|---|
| JP | 2016059796 A | * | 4/2016 | ......... G01R 33/5605 |
| JP | 2020-151106 A | | 9/2020 | |

OTHER PUBLICATIONS

Varma et al., "Keyhole Chemical Exchange Saturation Transfer", Magnetic Resonance in Medicine, 2012, vol. 68, pp. 1228-1233, XP055287143.

Morik et al., "A Combined Approach of Variable Flip Angle, Keyhole and Averaging (CAVKA) for Accelerating the Acquisition of a low SNR Image Series", Proceedings of the ISMRM & SMRT Virtual Conference & Exhibition, 2020, pp. 1-2, XP093008505, Retrieved from the Internet: URL:https://index.mirasmart.com/ISMRM2020/PDFfiles/3685.html>.

Extended European Search Report dated Jan. 3, 2023 in European Patent Application No. 22188154.3, 14 pages.

* cited by examiner

MAGNETIC RESONANCE IMAGING APPARATUS AND IMAGING-TIME SHORTENING METHOD

CROSS-REFERENCE TO RELATED APPLICATIONS

This application is based upon and claims the benefit of priority from Japanese Patent Application No. 2021-128584, filed on Aug. 4, 2021; the entire contents of which are incorporated herein by reference.

FIELD

Embodiments described herein relate generally to a magnetic resonance imaging apparatus, and an imaging-time shortening method.

BACKGROUND

Traditionally, magnetic resonance imaging (MRI) methods based on a chemical exchange saturation transfer (hereinafter, CEST) technique have been presented. Chemical exchange occurs between solute protons in a water pool and water protons. Such chemical exchange rate depends on temperature and pH, for example. Meanwhile, the resonance frequency of the protons vary depending on their state, which is referred to as chemical shift. As such, transmission of a radiofrequency (RF) saturation pulse at a frequency particular to the solute protons causes a phenomenon that saturation is transferred from the solute protons to the water protons, which are supposed to be unsaturated. Such a phenomenon is referred to as chemical exchange saturation transfer (CEST). CEST-based imaging methods are referred to as CEST imaging.

In CEST imaging, a single CEST-based image (hereinafter, CEST image) is obtained by repeatedly applying saturation pulses and acquiring magnetic resonance signals (hereinafter, MR signals) responsive to the applied saturation pulses. Specifically, to accurately obtain an influence (e.g., Z-spectrum) of CEST effects in a chemical shift, it is necessary to obtain MR images by applying multiple saturation pulses, for example, at frequencies −8 ppm to 8 ppm by increments of 0.1 ppm, with the free-water resonance frequency defined as zero ppm. That is, creation of a single Z-spectrum requires generation of 161 MR images, leading to an elongated imaging time. In addition, a failure in obtaining all the pieces of k-space data by one acquisition of magnetic resonance signals results in re-excitation and re-acquisition of MR signals, which will further elongate the length of imaging time.

DETAILED DESCRIPTION

According to an embodiment, the magnetic resonance imaging apparatus includes sequence control circuitry and processing circuitry. The sequence control circuitry is configured to perform a first sequence and a second sequence under different saturation pulse conditions. The first sequence is for acquiring first magnetic resonance signals corresponding to a first frequency region of a k-space and second magnetic resonance signals corresponding to a second frequency region of the k-space in chemical exchange saturation transfer "CEST" imaging. In CEST imaging a plurality of saturation pulses is applied to acquire a plurality of magnetic resonance signals responsive to the plurality of saturation pulses. The second sequence is for acquiring third magnetic resonance signals corresponding to at least the first frequency region in CEST imaging. The processing circuitry is configured to assign the third magnetic resonance signals and the second magnetic resonance signals to a single k-space generated for the second sequence. Frequency including the first frequency region is lower than frequency including the second frequency region.

Hereinafter, embodiments of a magnetic resonance imaging apparatus (hereinafter, MRI apparatus) and an imaging-time shortening method will be described with reference to the accompanying drawings. The following embodiments are presented for illustrative purposes only and not to be considered as limiting. In addition, descriptions and details of an embodiment are applicable to other embodiments in principle. Throughout the following embodiments, parts, portions, elements, or functions denoted by the same refer-

Embodiment

Figure 1:
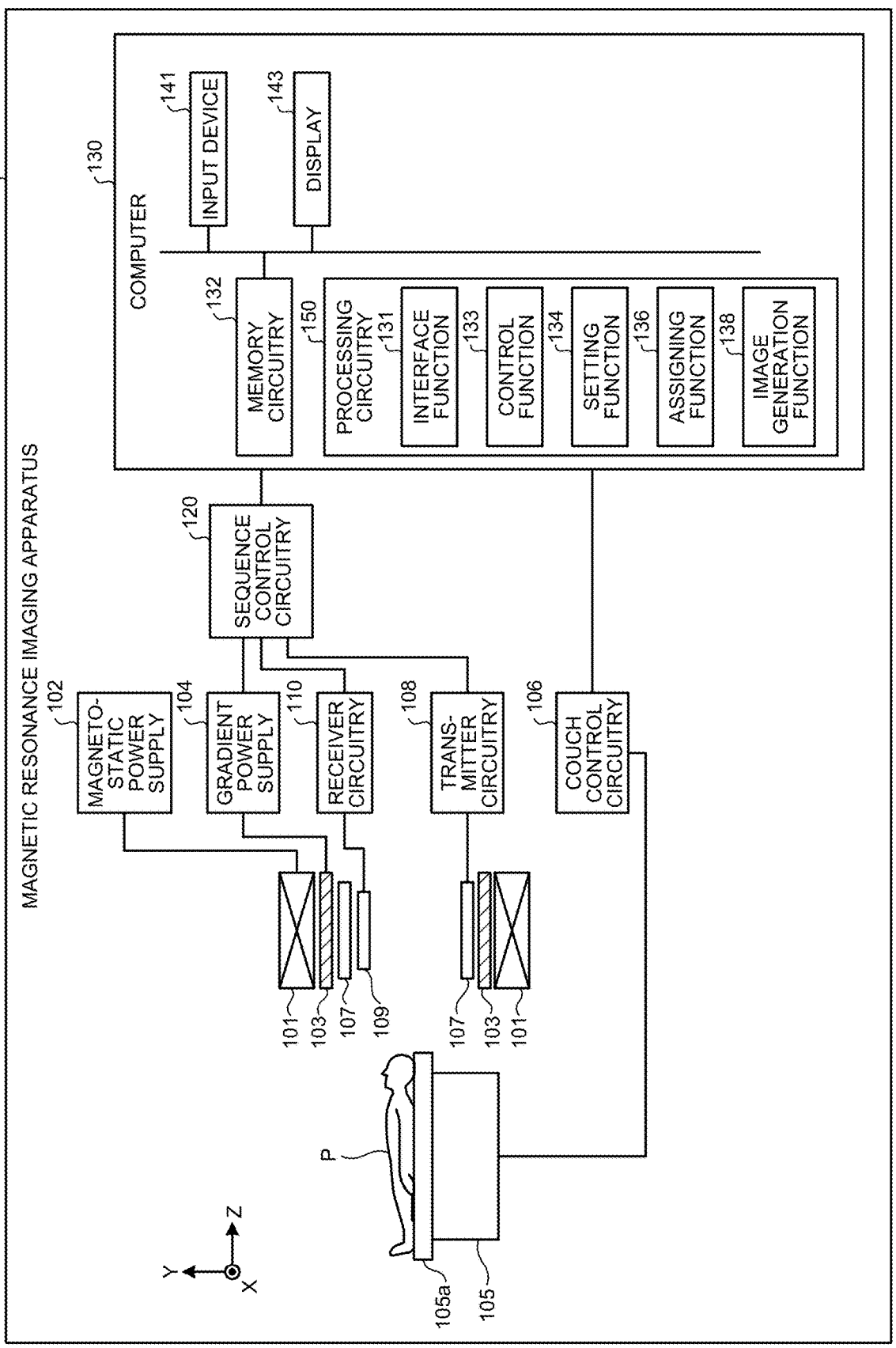
FIG. 1 is a block diagram of a magnetic resonance imaging apparatus according to an embodiment.

FIG. 1 is a block diagram of an MRI apparatus 100 according to an embodiment. As illustrated in FIG. 1, the MRI apparatus 100 includes magnetostatic magnets 101, a magnetostatic power supply 102, gradient coils 103, a gradient power supply 104, a couch 105, couch control circuitry 106, transmission coils 107, transmitter circuitry 108, a reception coil 109, receiver circuitry 110, sequence control circuitry 120, and a computer (also referred to as image processing apparatus) 130. The MRI apparatus 100 includes no subject P (such as a human body). The structure and configuration illustrated in FIG. 1 are merely exemplary. As an example, the elements of both the sequence control circuitry 120 and the computer 130 may be integrated or separated when appropriate.

The magnetostatic magnets 101 are hollow, substantially cylindrical magnets to generate static magnetic fields in an internal space. Examples of the magnetostatic magnets 101 include a superconducting magnet that magnetizes, supplied with a current from the magnetostatic power supply 102. The magnetostatic power supply 102 supplies currents to the magnetostatic magnets 101. The magnetostatic magnets 101 can be permanent magnets. In this case the MRI apparatus 100 may not include the magnetostatic power supply 102 or the magnetostatic power supply 102 may be separated from the MRI apparatus 100.

The gradient coils 103 are hollow, substantially cylindrical coils and located inside the magnetostatic magnets 101. Each gradient coil 103 is a combination of three coils corresponding to mutually orthogonal X-axis, Y-axis, and Z-axis. The three coils are individually supplied with currents from the gradient power supply 104, to generate gradient magnetic fields that vary in field strength along the X, Y, and Z-axes. The gradient magnetic fields generated along the X, Y, and Z-axes by the gradient coils 103 are exemplified by a slice gradient magnetic field Gs, a phase-encoding gradient magnetic field Ge, and a readout gradient magnetic field Gr. The gradient power supply 104 supplies currents to the gradient coils 103.

The couch 105 includes a tabletop 105a on which the subject P is to be laid. Under the control of the couch control circuitry 106, the couch 105 with the subject P lying thereon is inserted into a hollow space (imaging area) of the gradient coils 103. The couch 105 is typically installed such that its longitudinal side is parallel to the axes of the magnetostatic magnets 101. The couch control circuitry 106 serves to drive the couch 105 to move the tabletop 105a longitudinally and vertically under the control of the computer 130.

The transmission coils 107 are located inside the gradient coils 103, to generate high-frequency magnetic fields, supplied with an RF pulse from the transmitter circuitry 108. The transmitter circuitry 108 supplies RF pulses corresponding to the Larmor frequency to the transmission coils 107. The Larmor frequency is defined by a type of target atoms and a magnetic field strength.

The reception coil 109 is located inside the gradient coils 103, to receive magnetic resonance signals (hereinafter, MR signals) which are issued from the subject P due to an influence of the high-frequency magnetic field. The reception coil 109 outputs the MR signals to the receiver circuitry 110 upon receipt.

The transmission coils 107 and the reception coil 109 as described above are merely exemplary. Each of the transmission coils 107 and the reception coil 109 may be one or a combination of a coil having a transmission function alone, a coil having a reception function alone, and a coil having both transmission and reception functions.

The receiver circuitry 110 serves to detect MR signals output from the reception coil 109 and generate MR data from the detected MR signals. Specifically, the receiver circuitry 110 generates MR data by converting the MR signals output from the reception coil 109 into digital signals. The receiver circuitry 110 transmits the MR data to the sequence control circuitry 120. The receiver circuitry 110 may be included in a gantry apparatus equipped with the magnetostatic magnets 101 and the gradient coils 103.

The sequence control circuitry 120 serves to perform imaging of the subject P by driving the gradient power supply 104, the transmitter circuitry 108, and the receiver circuitry 110 according to sequence information transmitted from the computer 130. Herein, the sequence information is information representing defined imaging procedures and is also referred to as a sequence condition. The sequence information includes definitions of current intensity and current supply timing from the gradient power supply 104 to the gradient coils 103, RF pulse intensity and RF pulse application timing from the transmitter circuitry 108 to the transmission coils 107, and MR-signal detection timing by the receiver circuitry 110, for example.

Examples of the sequence control circuitry 120 include integrated circuitry such as an application specific integrated circuit (ASIC) and a field programmable gate array (FPGA), and electronic circuitry such as a central processing unit (CPU) and a micro processing unit (MPU). The sequence control circuitry 120 corresponds to a sequence control unit.

The sequence control circuitry 120 receives, from the receiver circuitry 110, MR data as a result of driving the gradient power supply 104, the transmitter circuitry 108, and the receiver circuitry 110 to image the subject P, and transfers the MR data to the computer 130.

The computer 130 serves to control the MRI apparatus 100 as a whole and generate images, for example. The computer 130 includes memory circuitry 132, an input device 141, a display 143, and processing circuitry 150. The processing circuitry 150 includes an interface function 131, a control function 133, a setting function 134, an assigning function 136, and an image generation function 138.

The processing and functions to be performed by the interface function 131, the control function 133, the setting function 134, the assigning function 136, and the image generation function 138 are stored in a computer-executable program format in the memory circuitry 132. The processing circuitry 15 serves as a processor that reads and executes programs from the memory circuitry 132 to implement the functions corresponding to the programs. In other words, as a result of reading the programs, the processing circuitry 150 includes the respective functions illustrated in FIG. 1.

FIG. 1 depicts an example that the single piece of processing circuitry 150 implements the processing and functions of the interface function 131, the control function 133, the setting function 134, the assigning function 136, and the image generation function 138. Alternatively, the processing circuitry 150 may be constituted of a combination of independent processors so that the processors individually implement the functions by executing the programs. In other words, the above functions may be configured as individual programs to be executed by the single piece of processing circuitry 150, or particular function or functions may be incorporated in dedicated, independent program-executable circuit or circuits.

The term "processor" used herein signifies, for example, circuitry such as a CPU, a graphical processing unit (GPU), an application specific integrated circuit, a programmable logic device (e.g., simple programmable logic device (SPLD)), a complex programmable logic device (CPLD), and a field programmable gate array (FPGA). The processor reads and executes programs from the memory circuitry 132 to implement the functions.

In place of being stored in the memory circuitry 132, the programs may be directly embedded in the circuitry of the processor. In such a case the processor reads and executes programs from its own circuitry to implement the functions. Likewise, the couch control circuitry 106, the transmitter circuitry 108, and the receiver circuitry 110 each include electronic circuitry such as the above processor.

The interface function 131 of the processing circuitry 150 serves to transmit sequence information to the sequence control circuitry 120 and receive MR data from the sequence control circuitry 120. The interface function 131 of the processing circuitry 150 also stores the MR data in the memory circuitry 132 upon receipt. The processing circuitry 150 implementing the interface function 131 corresponds to an interface unit. The MR data stored in the memory circuitry 132 is to be arranged in the k-space by the control function 133. The memory circuitry 132 stores k-space data therein.

The memory circuitry 132 stores therein the MR data as received by the interface function 131 of the processing circuitry 150, saturation pulse conditions set by the setting function 134 of the processing circuitry 150, k-space data arranged in the k-space by the assigning function 136 of the processing circuitry 150, image data generated by the image generation function 138 of the processing circuitry 150, and else. The memory circuitry 132 can be implemented by, for example, a semiconductor memory device such as a random access memory (RAM) or a flash memory, a hard disc, or an optical disc.

The input device 141 serves to receive various kinds of instructions and information inputs from the user. Examples of the input device 141 include a pointing device as a mouse or a trackball, a selective device as a mode switch, or an input device as a keyboard. The display 143 displays a graphical user interface (GUI) to allow the user to input for imaging conditions as well as images generated by the image generation function 138 of the processing circuitry 150 under the control of the control function 133 of the processing circuitry 150. The display 143 is, for example, a display device such as a liquid crystal display.

The control function 133 of the processing circuitry 150 serves to control the MRI apparatus 100 as a whole to control imaging, image generation, and image display, as an example.

The control function 133 of the processing circuitry 150 receives user inputs for an imaging condition (such as imaging parameters) via the GUI to generate sequence information under the imaging condition and a saturation pulse condition set by the setting function 134, for example. The control function 133 of the processing circuitry 150 then transmits the sequence information to the sequence control circuitry 120. The processing circuitry 150 implementing the control function 133 corresponds to a control unit.

The image generation function 138 of the processing circuitry 150 reads k-space data from the memory circuitry 132, and performs a reconstruction process including Fourier transformation to the k-space data to generate an image. The processing circuitry 150 implementing the image generation function 138 corresponds to an image generator unit. The setting function 134 and the assigning function 136 of the processing circuitry 150 will be described later. The processing circuitry 150 implementing the setting function 134 corresponds to a setting unit. The processing circuitry 150 implementing the assigning function 136 corresponds to an assigning unit.

Chemical exchange saturation transfer (CEST) effects related to the present embodiment are briefly explained. Free (bulk) water protons and compound protons are mutually exchangeable. For example, compound protons as amide groups (—NH), hydroxyl groups (—OH), and amino groups (—NH2) are exchangeable protons. The CEST effects are defined by quantities such as Z-spectrum and MTRasym spectrum. A magnetic resonance (MR) imaging technique (hereinafter, CEST imaging) is CEST-effect based imaging that utilizes exchanges between free water protons and amide (—NH), hydroxyl (—OH), or amino (—NH2) protons, for example.

By the CEST-effect based MR imaging technique (CEST imaging), the sequence control circuitry 120 applies, before acquiring MR signals, saturation pulses to the subject P at a resonance frequency of exchangeable protons (e.g., compound protons), that is, at an off-resonance frequency apart from the free-water resonance frequency. The saturation pulses are frequency-selective radiofrequency (RF) pulses and also referred to as presaturation pulses. Specifically, CEST imaging is a magnetic resonance imaging technique to apply saturation pulses and acquire MR signals responsive to the saturation pulses.

Figure 2:
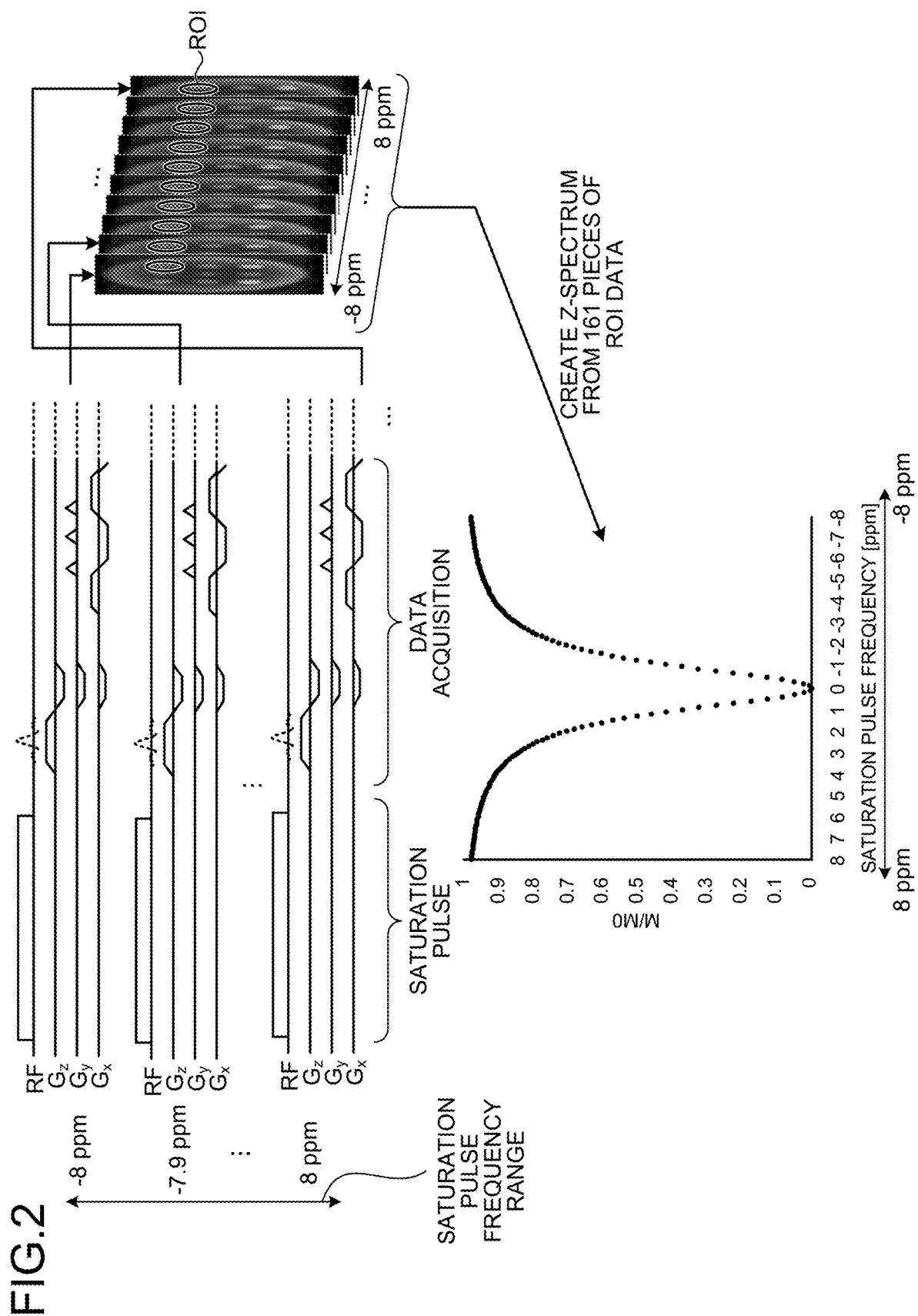
FIG. 2 is a comparative example of CEST imaging.

A comparative example of CEST imaging will be described with reference to FIG. 2. FIG. 2 illustrates one comparative example of CEST imaging. For the sake of simple explanation, the frequency of the saturation pulses used in CEST imaging is defined to be in the range of −8 ppm to 8 ppm by increments of 0.1 ppm. At a static field strength of 3 T, for example, the saturation pulse frequency corresponding to zero ppm matches the free-water resonance frequency (hereinafter, referred to as center frequency) based on a static field strength, i.e., 128 MHz. The saturation pulse frequency corresponding to +8 ppm is (128 MHz+128×8 Hz). The saturation pulse frequency corresponding to −8 ppm is (128 MHz−128×8 Hz).

According to the comparative CEST imaging, as illustrated in FIG. 2, MR images are obtained by applying saturation pulses at frequencies from −8 ppm to 8 ppm by increments of 0.1 ppm, with the center frequency defined as zero ppm. Based on 161 MR images, thus, a Z-spectrum representing CEST effects due to correction of static magnetic field (B0) inhomogeneities and an accurate chemical shift after the correction is generated. In this regard, this comparative CEST imaging presents a disadvantage of a longer imaging time with respect to the subject P in terms of Z-spectrum generation.

In view of this, the present embodiment intends to shorten the length of imaging time in generating multiple MR images for the Z-spectrum generation. To generate a Z-spectrum, contrast components of each MR image matter. The contrast components of an MR image depend on MR signals in the low frequency region (first frequency region) of k-space data based on which the MR image concerned is generated.

Figure 3:
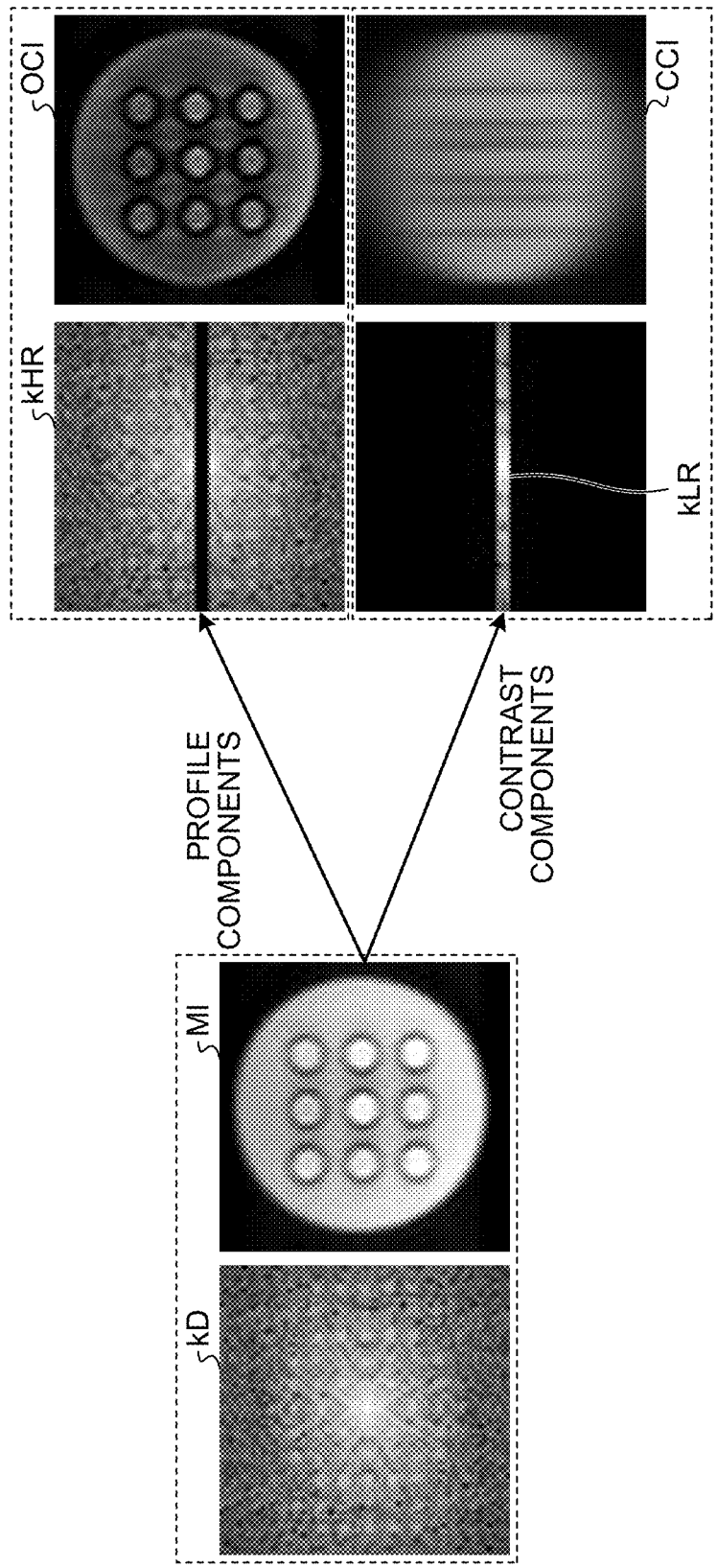
FIG. 3 illustrates contrast components and profile components of k-space data and an MR image according to an embodiment by way of example.

FIG. 3 depicts contrast components and profile components of k-space data kD and an MR image MI by way of example. As illustrated in FIG. 3, contrast components CCI of the MR image MI correspond to a low frequency region kLR of the k-space data. Profile components OCI of the MR image MI correspond to a high frequency region (second frequency region) kHR of the k-space data. According to the present embodiment, imaging is performed under a saturation pulse condition for the low frequency region kLR of the k-space, which is dominant in terms of Z-spectrum generation, and the MR signals obtained by different imaging are used for the high frequency region kHR of the k-space as a substitute. Thereby, the present embodiment can provide CEST imaging pulse sequences which enable a shortened imaging time for the Z-spectrum generation.

The low frequency region refers to a region including the center of the k-space and included in a predetermined range from the center of the k-space. As illustrated in FIG. 3, the low frequency region kLR is exemplified by a quadrangular region including the center of the k-space. Both ends of the low frequency region kLR may be extended to the ends of the k-space. In this case the low frequency region kLR has a strip form, as illustrated in FIG. 3. The high frequency region corresponds to a region outside the low frequency region and is adjacent to the low frequency region in the k-space. When the low frequency region kLR is of a strip form as illustrated in FIG. 3, the high frequency region kHR corresponds to two strip-like regions outside the low frequency region kLR.

Figure 4:
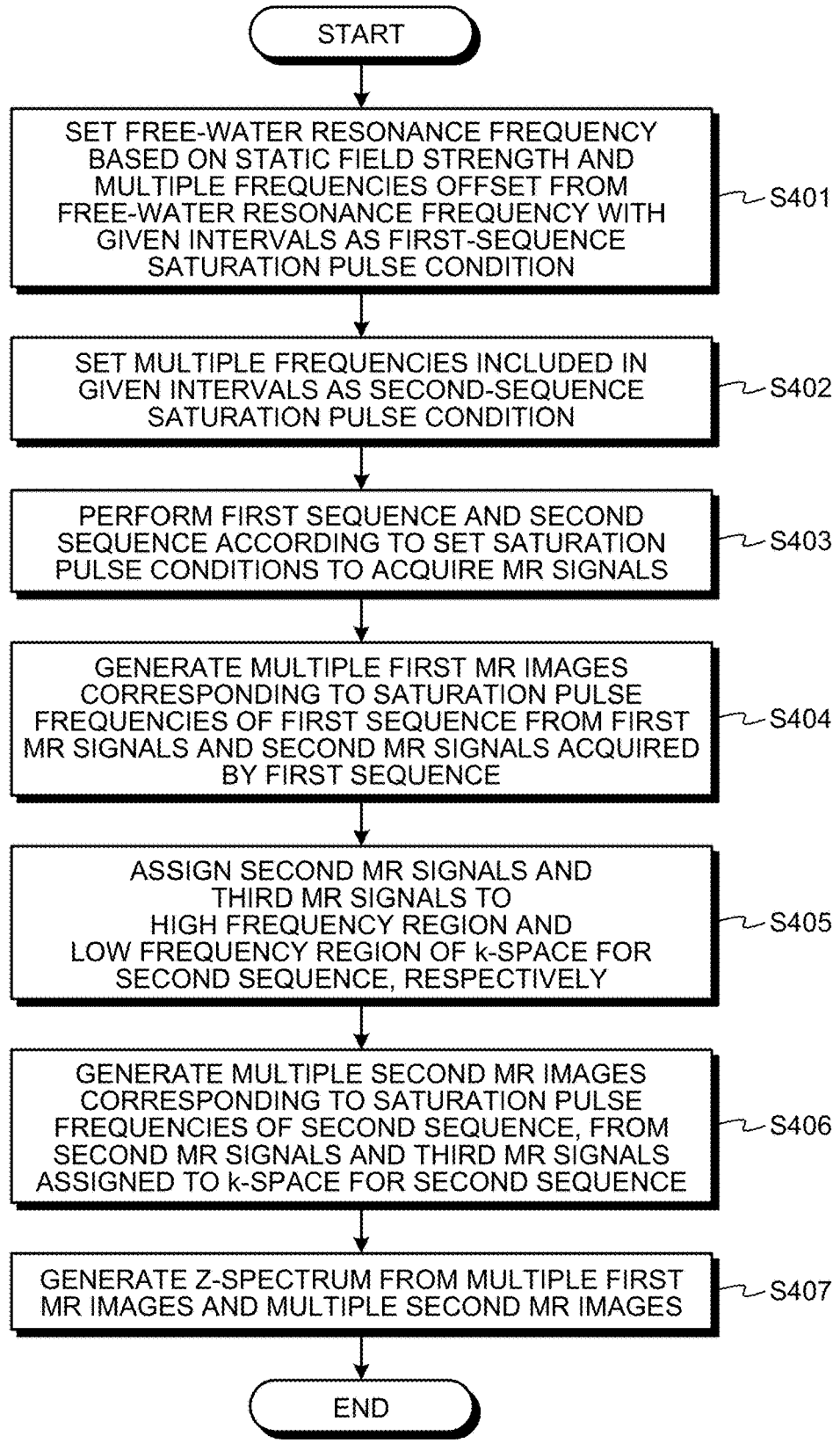
FIG. 4 is a flowchart illustrating an exemplary shortened CEST imaging process according to an embodiment.

The above has described the overall structure of the MRI apparatus 100 of an embodiment. Having such a structure, the MRI apparatus 100 of an embodiment can perform CEST imaging in a shorter length of imaging time than the comparative example to generate a Z-spectrum (hereinafter, referred to as shortened CEST imaging process). In the following, an outline of the shortened CEST imaging process will be described with reference to FIG. 4. FIG. 4 is a flowchart illustrating an exemplary shortened CEST imaging process.

For the sake of simple explanation, the static field strength is defined as 3 T, and the frequencies at which saturation pulses are applied in CEST imaging are defined to be in the range of −8 ppm to 8 ppm. The saturation pulse frequency corresponding to zero ppm, i.e., center frequency, is at 128 MHz. The frequency range in which saturation pulses are applied in CEST imaging can be appropriately set by the setting function 134.

Shortened CEST Imaging Process

Step S401

The processing circuitry 150 uses the setting function 134 to set a free-water resonance frequency based on a static field strength (center frequency) and multiple frequencies offset from the free-water resonance frequency at predetermined frequency intervals as a saturation pulse condition for a first sequence. The first sequence refers to a pulse sequence for acquiring first MR signals corresponding to the low frequency region of the k-space and second MR signals corresponding to the high frequency region of the k-space.

As an example, the setting function 134 sets, in the k-space, as the low frequency region, a contrast contributive region of the MR image generated from the MR signals, i.e., a region reflecting contrast components in the MR image. The frequency intervals are preset, or set in accordance with a user's instruction given via the input device 141.

In the following the frequency intervals are defined as 1 ppm, that is, 128 Hz, for the sake of simple explanation. The first sequence is thus performed at 17 frequencies, 128 MHz and 16 frequencies (128 MHz±128×(1 to 8) Hz) in total. The frequency intervals are not limited to 1 ppm and can be optionally set by the setting function 134.

Step S402

The setting function 134 sets multiple frequencies included in the frequency intervals as a saturation pulse condition for a second sequence. The second sequence refers to a pulse sequence for acquiring third MR signals corresponding to at least the low frequency region of the k-space. The multiple frequencies are incremented by 0.1 ppm, for example. There are, for example, nine different frequencies (128 MHz+128×(1 to 9)×0.1 Hz) between zero ppm and 1 ppm. The saturation pulse frequency intervals at which the second sequence is performed are not limited to 0.1 ppm and can be optionally set by the setting function 134.

Alternatively, the saturation pulse condition for the second sequence may include frequencies except for ten frequency adjacent to the center frequency, may include frequencies except for ±1.0 ppm with respect to the center frequency, or may include frequencies except for 10% of the total number of Z-spectrums with respect to the center frequency.

Step S403

The sequence control circuitry 120 performs the first sequence and the second sequence under different saturation pulse conditions in CEST imaging. Thus, the sequence control circuitry 120 performs the first sequence and the second sequence according to the set conditions. Specifically, the sequence control circuitry 120 performs the first sequence and the second sequence until completion of applying saturation pulses according to the set saturation pulse conditions and acquiring MR signals responsive to the applied saturation pulses. The sequence control circuitry 120 acquires first MR signals and second MR signals, or third MR signals in accordance with the saturation pulse frequencies.

Step S404

The processing circuitry 150 uses the image generation function 138 to generate multiple first MR images corresponding to the saturation pulse frequencies of the first sequence from the first MR signals and the second MR signals acquired by the first sequence. Specifically, the assigning function 136 assigns the first MR signals and the second MR signals to a single k-space generated for the first sequence. The image generation function 138 then performs a Fourier transformation to k-space data having the first MR signals and the second MR signals assigned thereto, to generate a first MR image. In more detail the image generation function 138 arranges the first MR signals and the second MR signals corresponding to the total 17 frequencies of 128 MHz and 16 frequencies (128 MHz±128×(1 to 8) Hz) in the k-space, and performs a Fourier transformation to k-space data set in the k-space. In this manner the image generation function 138 generates first MR images corresponding to the 17 frequencies.

Step S405

The processing circuitry 150 uses the assigning function 136 to assign the third MR signals and the second MR signals to a single k-space generated for the second sequence. Specifically, the assigning function 136 assigns the second MR signals acquired by the first sequence to the high frequency region of the k-space for the second sequence under the saturation pulse condition. In more detail the assigning function 136 identifies the saturation pulse frequency of the first sequence closest to the saturation pulse frequencies of the second sequence. The assigning function 136 then assigns the second MR signals obtained at the identified frequency to the high frequency region by the second sequence and assigns the third MR signals to the low frequency region by the second sequence.

In this manner the low frequency region of the k-space related to the second sequence is filled with the third MR signals while the high frequency region of the k-space related to the second sequence is filled with the second MR signals. In other words, the second MR signals, i.e., MR signals assigned to the high frequency region of the k-space related to the second sequence, are also used as substitute MR signals to fill the high frequency region of the k-space related to the first sequence. Such k-space data sharing is also referred to as view sharing.

Step S406

The processing circuitry 150 uses the image generation function 138 to generate multiple second MR images corresponding to the saturation pulse frequencies of the second sequence from the second MR signals and the third MR signals assigned to the k-space related to the second sequence. Specifically, the image generation function 138 generates a number of second MR images (2×8×9=144 second MR images in the present embodiment) corresponding to all of nine frequencies (128 MHz±128 (i+0.1×j) Hz where i is any natural number from zero to 7 and j is a natural number from 1 to 9) between i-ppm and ±(i+1) ppm.

Step S407

The processing circuitry 150 uses the image generation function 138 to generate a Z-spectrum from the first MR images and the second MR images. The Z-spectrum can be generated by an existing method, therefore, a description thereof is omitted. The generation of the Z-spectrum completes the shortened CEST imaging process. Note that the order of executing step S404 is not limited to the one illustrated in FIG. 4. Step S404 may be executed anywhere between steps S403 and S407.

Figure 5:
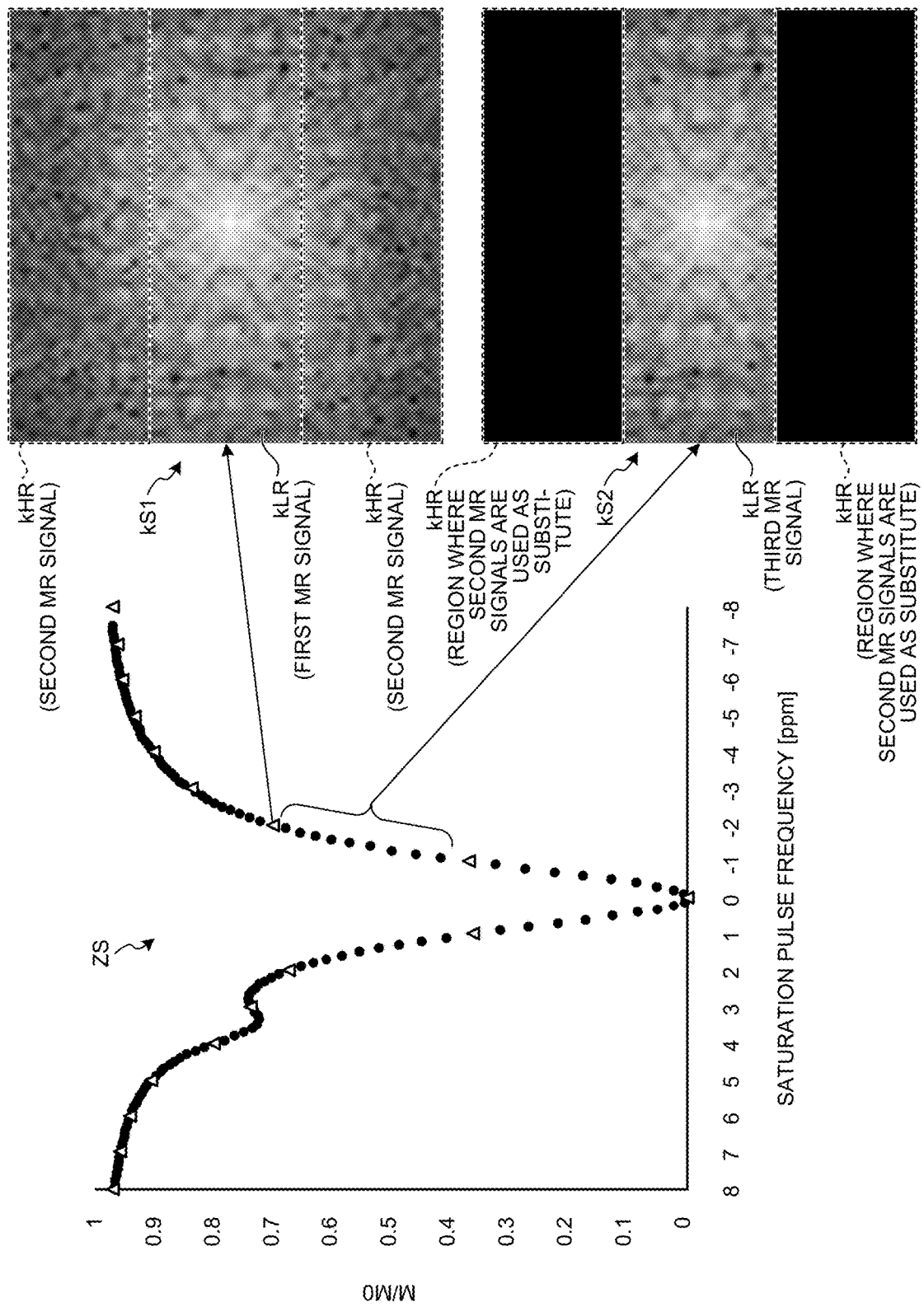
FIG. 5 schematically illustrates an outline of the shortened CEST imaging process in an embodiment.

FIG. 5 schematically illustrates an outline of the shortened CEST imaging process. In a Z-spectrum graph ZS of FIG. 5, the vertical axis indicates a ratio (M/M0; hereinafter, signal ratio) of an MR signal value M when applied with the saturation pulse to an MR signal value M0 when applied with no saturation pulse, and the horizontal axis indicates the saturation pulse frequencies in ppm. In the Z-spectrum graph ZS of FIG. 5, the triangular symbols represent signal ratios relative to saturation pulse frequencies in the first sequence while the circular symbols represent signal ratios relative to saturation pulse frequencies in the second sequence.

As illustrated in FIG. 5, by the first sequence, the MR signals (first and second MR signals) are acquired for the entire k-space (low frequency region kLR and high frequency regions kHR). Thus, the low frequency region kLR of a k-space kS1 related to the first sequence is filled with the first MR signals while the high frequency regions kHR of the k-space kS1 are filled with the second MR signals, as illustrated in FIG. 5.

Meanwhile, by the second sequence, the MR signals (third MR signals) corresponding to the low frequency region kLR of the k-space are acquired, as illustrated in FIG. 5. This can shorten the imaging time in CEST imaging. The low frequency region kLR of a k-space kS2 related to the second sequence is filled with the third MR signals while the high frequency regions kHR of the k-space kS2 are filled with the substitute second MR signals, as illustrated in FIG. 5.

To generate MR images for use in generation of the Z-spectrum, the assigning function 136 identifies the triangular symbol (first sequence) closest or adjacent to each of the circular symbols (second sequence) in FIG. 5 according to the saturation pulse condition (saturation pulse frequency) of the circular symbol in question, and the high frequency regions kHR of the k-space kS2 related to the second sequence are filled with the substitute second MR signals (view sharing), as explained above.

In CEST imaging, under the respective saturation pulse conditions the MRI apparatus 100 of the embodiments as described above performs the first sequence for acquiring the first MR signals corresponding to the low frequency region kLR of the k-space and the second MR signals corresponding to the high frequency regions kHR of the k-space as well as performs the second sequence for acquiring the third MR signals corresponding to at least the low frequency region kLR, to assign the second MR signals to the high frequency regions kHR of the k-space related to the second sequence according to the saturation pulse conditions. Specifically, the MRI apparatus 100 sets the center frequency and the frequencies (as indicated by the triangular symbols in FIG. 5) offset from the center frequency at the frequency intervals as the saturation pulse condition for the first sequence, and sets the frequencies included in the frequency intervals as the saturation pulse condition for the second sequence, to perform the first sequence and the second sequence according to the respective saturation pulse conditions as set.

Thereby, the MRI apparatus 100 can perform the second sequence to acquire only the third MR signals for the low frequency region kLR at the frequency intervals as illustrated in FIG. 5, enabling great reduction in the imaging time in CEST imaging. Further, the second sequence is for acquiring the MR signals corresponding to the low frequency region kLR which contributes to the contrast of the MR image, so as to be able to maintain the contrast of the second MR images for use in Z-spectrum generation. Moreover, the MRI apparatus 100 obtains accurate data by performing the first sequence at the center frequency while using less important k-space data in the high frequency regions kHR for the k-space related to the second sequence as a substitute. Consequently, the MRI apparatus 100 can substantially shorten a duration of time-consuming CEST imaging while limiting an influence on the Z-spectrum generation.

First Modification

A first modification differs from the embodiments in performing the first sequence at near the center frequency. The processing circuitry 150 uses the setting function 134 to set frequencies included in a predetermined range around the center frequency as a saturation pulse condition for the first sequence. Specifically, the setting function 134 sets frequencies in a predetermined range around the center frequency, e.g., ±1 ppm as the saturation pulse condition for the first sequence. The frequencies are, for example, from −1 ppm to +1 ppm by increments of 0.1 ppm. The predetermined range is not limited to the range from −1 ppm to +1 ppm and can be set to any range via the input device 141.

Figure 6:
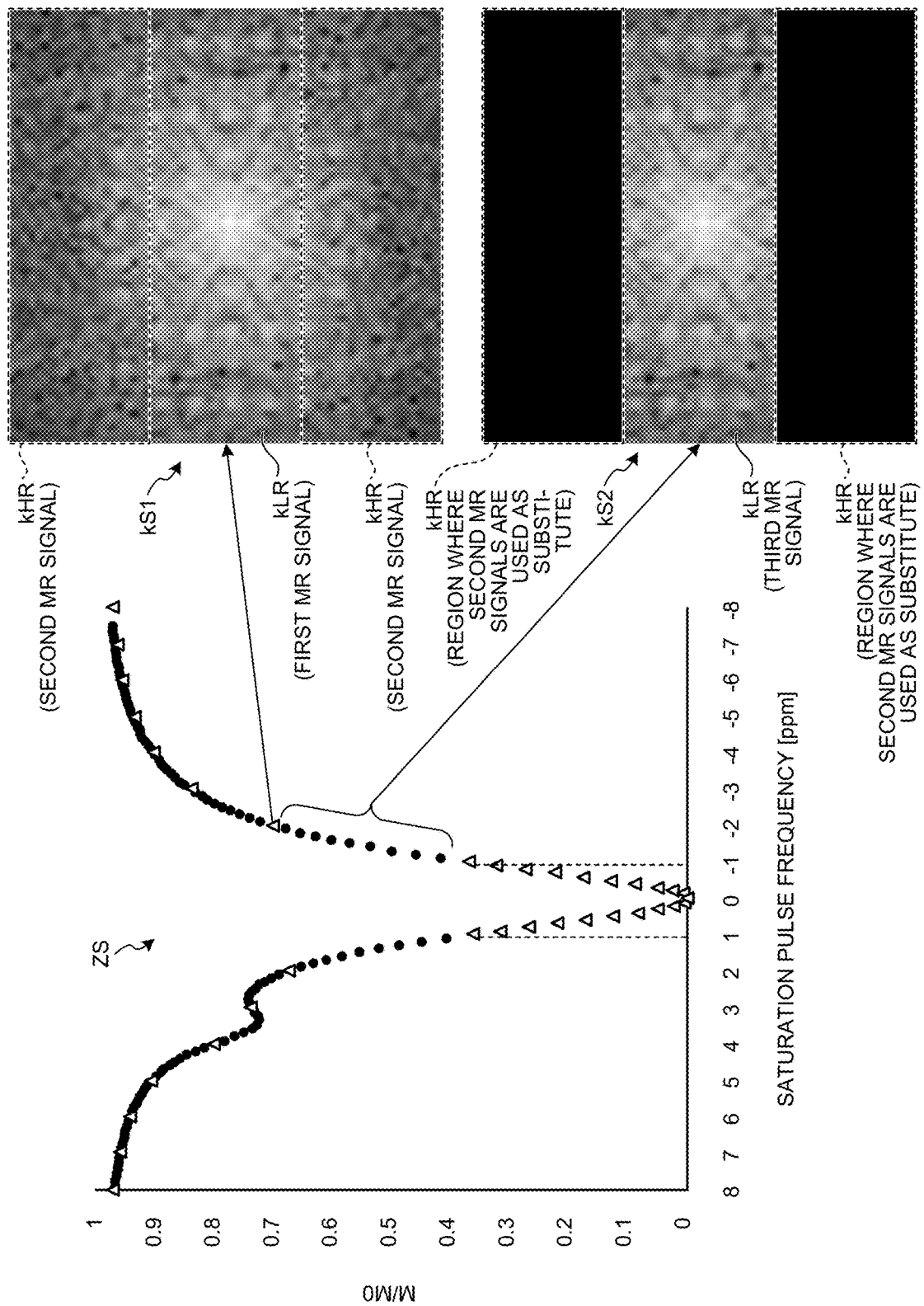
FIG. 6 schematically illustrates an outline of a shortened CEST imaging process in a first modification of the embodiments.

FIG. 6 schematically illustrates an outline of the shortened CEST imaging process of the first modification. In the Z-spectrum graph ZS of FIG. 6, the triangular symbols represent signal ratios relative to saturation pulse frequencies in the first sequence while the circular symbols represent signal ratios relative to saturation pulse frequencies in the second sequence. As illustrated in FIG. 6, the first sequence is performed at 21 different frequencies in the vicinity of the center frequency of zero ppm. The rest of the saturation pulse frequencies are similar or the same as in the embodiments.

The MRI apparatus 100 of the first modification of the embodiments as above sets the frequencies included in a predetermined range around the center frequency as the saturation pulse condition for the first sequence. According to the first modification, thus, the MRI apparatus 100 acquires the MR signals for the entire k-space in the frequency range including the center frequency to be able to generate more accurately rendered first MR images. Consequently, the MRI apparatus 100 can improve the Z-spectrum in accuracy in the vicinity of the center frequency, in addition to exerting the effects of the embodiments.

Second Modification

The features of a second modification are in determining a minimum value of signal ratios in the Z-spectrum and setting a frequency corresponding to the minimum value (hereinafter, minimum frequency) as a saturation pulse condition, to perform CEST imaging.

The sequence control circuitry 120 performs the first sequence while shifting the saturation pulse frequency from the center frequency, until the first MR image generated from the first MR signals and the second MR signals exhibits signal intensity (signal ratio) of a minimum value. Thereby, the minimum value of the signal ratios in the vicinity of the center frequency can be determined.

The processing circuitry 150 uses the setting function 134 to set frequencies included in a predetermined range centered around the minimum frequency, e.g., at ±1 ppm, and frequencies offset from the minimum frequency at predetermined frequency intervals as a saturation pulse condition for the first sequence. The minimum frequency in the second modification corresponds to the center frequency in the first modification. That is, in the second modification the center frequency of the first modification is determined as the minimum frequency.

The setting function 134 sets the frequencies included in the frequency intervals as a saturation pulse condition for the second sequence. Alternatively, the setting function 134 may set, as the saturation pulse condition for the second sequence, frequencies except for ten frequencies adjacent to the minimum frequency, frequencies except for the ones of ±1.0 ppm from the minimum frequency, or frequencies except for 10% of the total number of Z-spectrums with respect to the minimum frequency.

Figure 7:
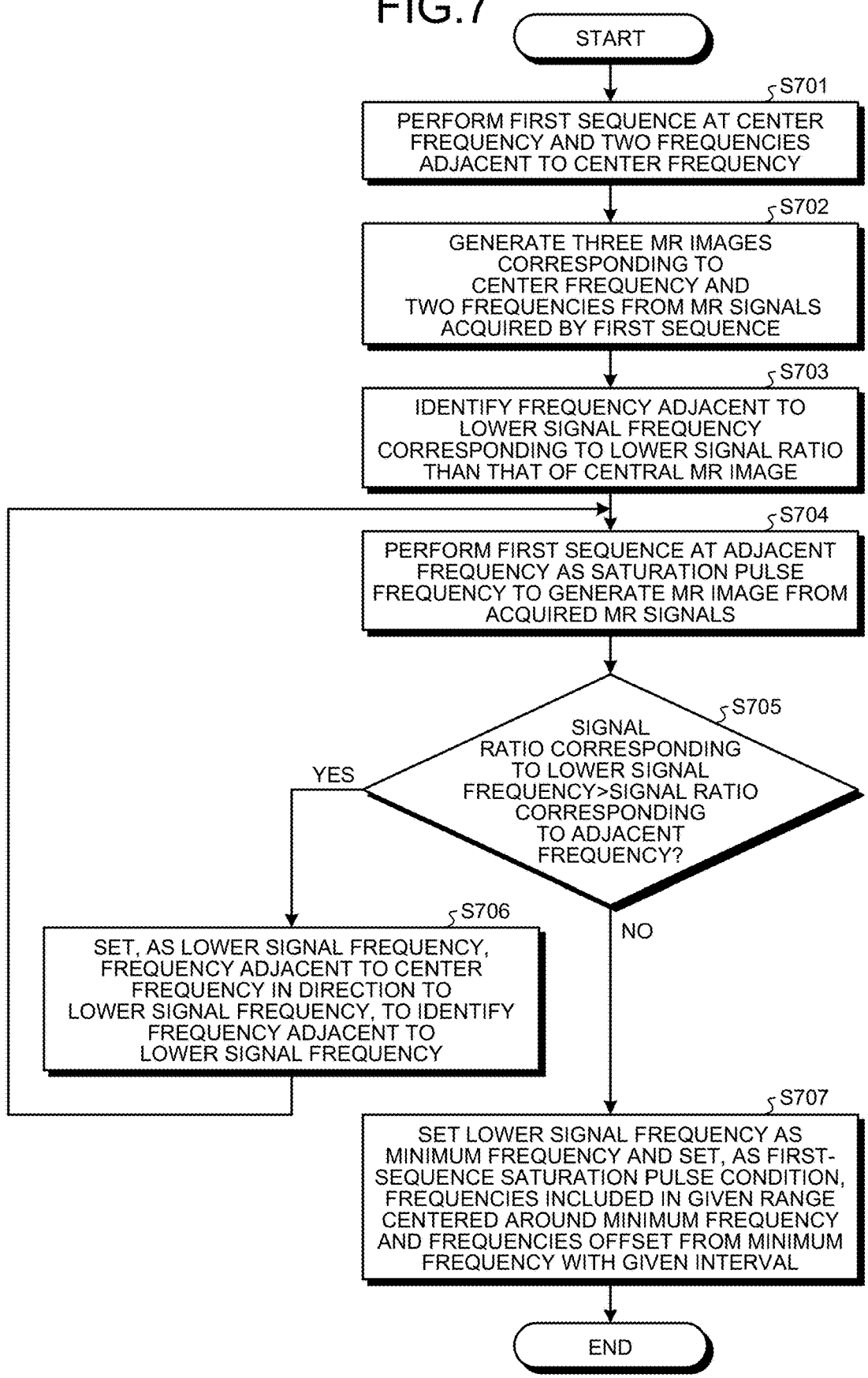
FIG. 7 is a flowchart illustrating an exemplary minimum-frequency setting process according to a second modification of the embodiments.

FIG. 7 is a flowchart illustrating a process of setting the minimum frequency (hereinafter, minimum-frequency setting process) by way of example. The minimum-frequency setting process is performed before step S401 in FIG. 4. Thus, at step S401 of the shortened CEST imaging process, the operation at step S707 of the minimum-frequency setting process is performed in the second modification.

Minimum-Frequency Setting Process

Step S701

The processing circuitry 150 uses the setting function 134 to set two frequencies adjacent to the center frequency as saturation pulse frequencies. The two frequencies are, for example, 128 MHz±12.8 Hz (±0.1 ppm). The sequence control circuitry 120 performs the first sequence at the center frequency and the two frequencies adjacent to the center frequency.

Step S702

The processing circuitry 150 uses the image generation function 138 to generate three MR images corresponding to the center frequency and the two frequencies from the MR signals acquired by the first sequence. The image generation function 138 calculates the signal ratio of each of the three MR images.

Step S703

The setting function 134 identifies a frequency adjacent to a lower signal frequency corresponding to a lower signal ratio than that of the central MR image. The lower signal frequency refers to one, of the two frequencies, corresponding to a lower signal ratio than that of the central MR image. As an example, when the signal ratio of the MR image corresponding to a frequency +0.1 ppm is lower than the signal ratio corresponding to the center frequency 128 MHz, the setting function 134 identifies the frequency+0.1 ppm as a lower signal frequency. The setting function 134 then identifies an adjacent frequency to the center frequency in the direction to the lower signal frequency. In this case the adjacent frequency is a frequency+0.2 ppm.

The minimum-frequency setting process ends when the signal ratios of the two MR images corresponding to the two frequencies are not lower than that of the central MR image. In this case the minimum frequency matches the center frequency.

Step S704

The sequence control circuitry 120 performs the first sequence at the adjacent frequency as a saturation pulse frequency. The image generation function 138 generates an MR image corresponding to the adjacent frequency from the MR signals acquired by the first sequence. The image generation function 138 calculates the signal ratio of the MR image.

Step S705

The setting function 134 compares the signal ratio relative to the lower signal frequency and the signal ratio relative to the adjacent frequency. When the signal ratio relative to the lower signal frequency exceeds the signal ratio relative to the adjacent frequency (Yes at step S705), the setting function 134 proceeds to step S706. When the signal ratio relative to the lower signal frequency matches or is below the signal ratio relative to the adjacent frequency (No at step S705), the setting function 134 proceeds to step S707.

Step S706

The setting function 134 sets, as a lower signal frequency, a frequency adjacent to the center frequency in the direction to the lower signal frequency, to identify a frequency adjacent to the lower signal frequency. In other words, the setting function 134 changes the adjacent frequency to the lower signal frequency and identifies the frequency adjacent to the lower signal frequency after change. In this manner the setting function 134 sets a new adjacent frequency in the direction from the center frequency to the lower signal frequency. After step S706, the process returns to step S704.

Step S707

The setting function 134 sets the lower signal frequency as the minimum frequency. The setting function 134 sets, as a saturation pulse condition for the first sequence, frequencies included in a predetermined range centered around the minimum frequency and frequencies offset from the minimum frequency at predetermined frequency intervals. After this step, step S402 and subsequent steps in the shortened CEST imaging process follow.

The sequence control circuitry 120 thus performs the first sequence and the second sequence until completion of applying saturation pulses at the frequencies in the saturation pulse condition. The first sequence is not to be performed at saturation pulse frequencies (at least the center frequency and the two frequencies in step S701) at which signal ratios have been already computed, among the set saturation pulse frequencies.

As described above, the MRI apparatus 100 of the second modification of the embodiments performs the first sequence while shifting the saturation pulse frequency from the center frequency, until the signal intensity of the MR image generated from the first MR signals and the second MR signals matches the minimum value. The MRI apparatus 100 then sets, as the saturation pulse condition for the first sequence, frequencies offset from the minimum frequency corresponding to the minimum value at the predetermined frequency intervals as well as frequencies included in the predetermined range centered around the minimum frequency, and sets frequencies included in the frequency intervals as the saturation pulse condition for the second sequence.

Figure 8:
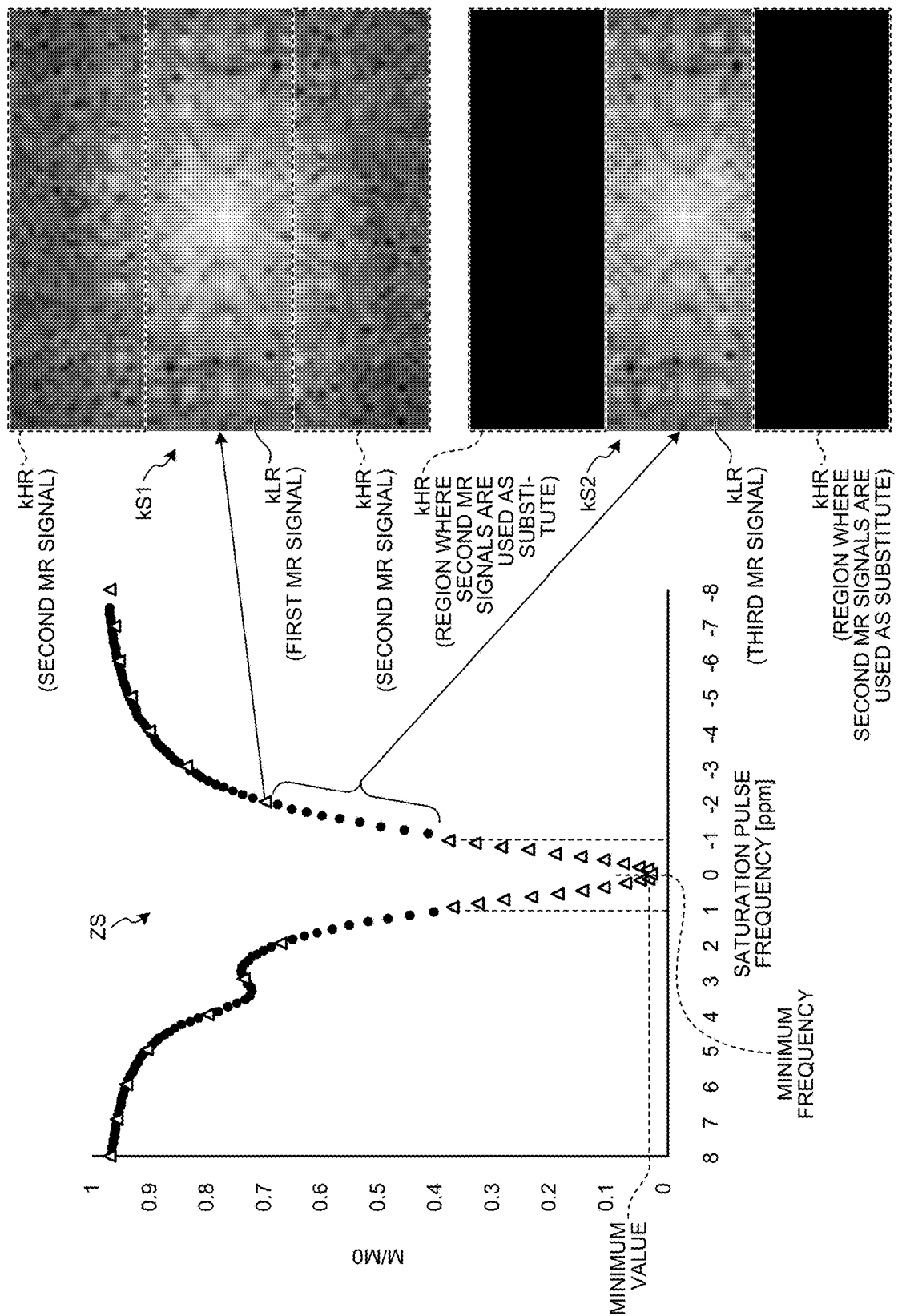
FIG. 8 schematically illustrates an outline of the minimum-frequency setting process and a shortened CEST imaging process in the second modification of the embodiments.

FIG. 8 schematically illustrates an outline of the minimum-frequency setting process and the shortened CEST imaging process. In the Z-spectrum graph ZS of FIG. 8, the triangular symbols represent signal ratios relative to saturation pulse frequencies in the first sequence while the circular symbols represent signal ratios relative to saturation pulse frequencies in the second sequence. As illustrated in FIG. 8, the first sequence is performed at 21 different saturation pulse frequencies in the vicinity of the minimum value. The rest of the saturation pulse frequencies are similar or the same as in the embodiments. In the second modification, by determining the minimum value of the signal ratios, it is possible to determine the minimum frequency corresponding to the center frequency considering the static magnetic field (B0) inhomogeneities.

In addition, the MRI apparatus 100 of the second modification of the embodiments can set the saturation pulse conditions (frequencies) for the first sequence and the second sequence depending on the minimum frequency, leading to improving the accuracy of the Z-spectrum at near the center frequency. As such, according to the second modification the MRI apparatus 100 can further improve the accuracy of the Z-spectrum at near the center frequency, taking the static magnetic field (B0) inhomogeneities into account, in addition to exerting the effects of the embodiments.

Third Modification

A third modification differs from the embodiments in setting frequencies adjacent to the frequencies related to the CEST effects as a saturation pulse condition for the first sequence. As an example, the setting function 134 sets, as a saturation pulse condition for the first sequence, frequencies included in a predetermined range centered around a frequency corresponding to a peak of signal intensity (hereinafter, peak frequency) due to the CEST effects. Specifically, the setting function 134 sets the peak frequency in accordance with agents having physical properties which affect the CEST effects (hereinafter, CEST agents). CEST agents refer to agents that cause chemical exchange of protons present in a region of interest (ROI). Examples of the CEST agents include amide groups and substances for use in a ratiometric method (e.g., iopamidol). Physical properties refer to temperature and hydrogen index (pH), for example.

Figure 9:
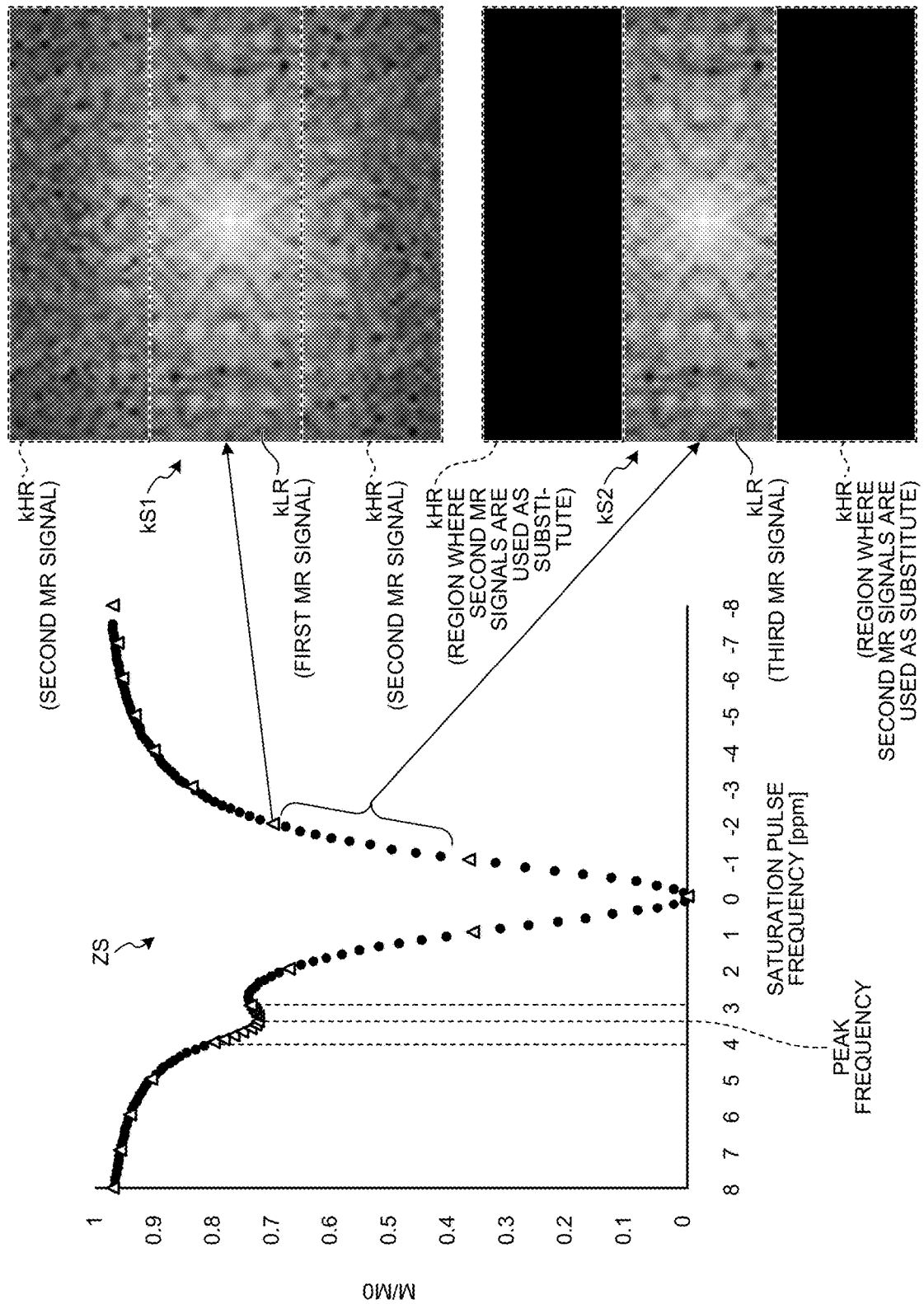
FIG. 9 schematically illustrates an outline of a shortened CEST imaging process in a third modification of the embodiment, taking amide groups as an example of agents to cause chemical exchange of protons present in a region of interest.

FIG. 9 schematically illustrates an outline of the shortened CEST imaging process, taking amide groups as an exemplary agent causing chemical exchange of protons present in a region of interest. In the Z-spectrum graph ZS of FIG. 9, the triangular symbols represent signal ratios relative to saturation pulse frequencies in the first sequence while the circular symbols represent signal ratios relative to saturation pulse frequencies in the second sequence. As illustrated in FIG. 9, the peak frequency of the amide groups appears at the bottom of a downward curve on the Z-spectrum graph ZS and is at 3.5 ppm according to literature data.

As illustrated in FIG. 9, the processing circuitry 150 uses the setting function 134 to set frequencies included in a predetermined range (e.g., ±1 ppm) around the peak frequency as a saturation pulse condition for the first sequence. The frequencies are, for example from 2.5 ppm to 4.5 ppm by increments of 0.1 ppm. The predetermined range is not limited to the range of 2.5 ppm to 4.5 ppm and can be optionally set via the input device 141. The rest of the saturation pulse frequencies are similar or the same as in the embodiments.

Figure 10:
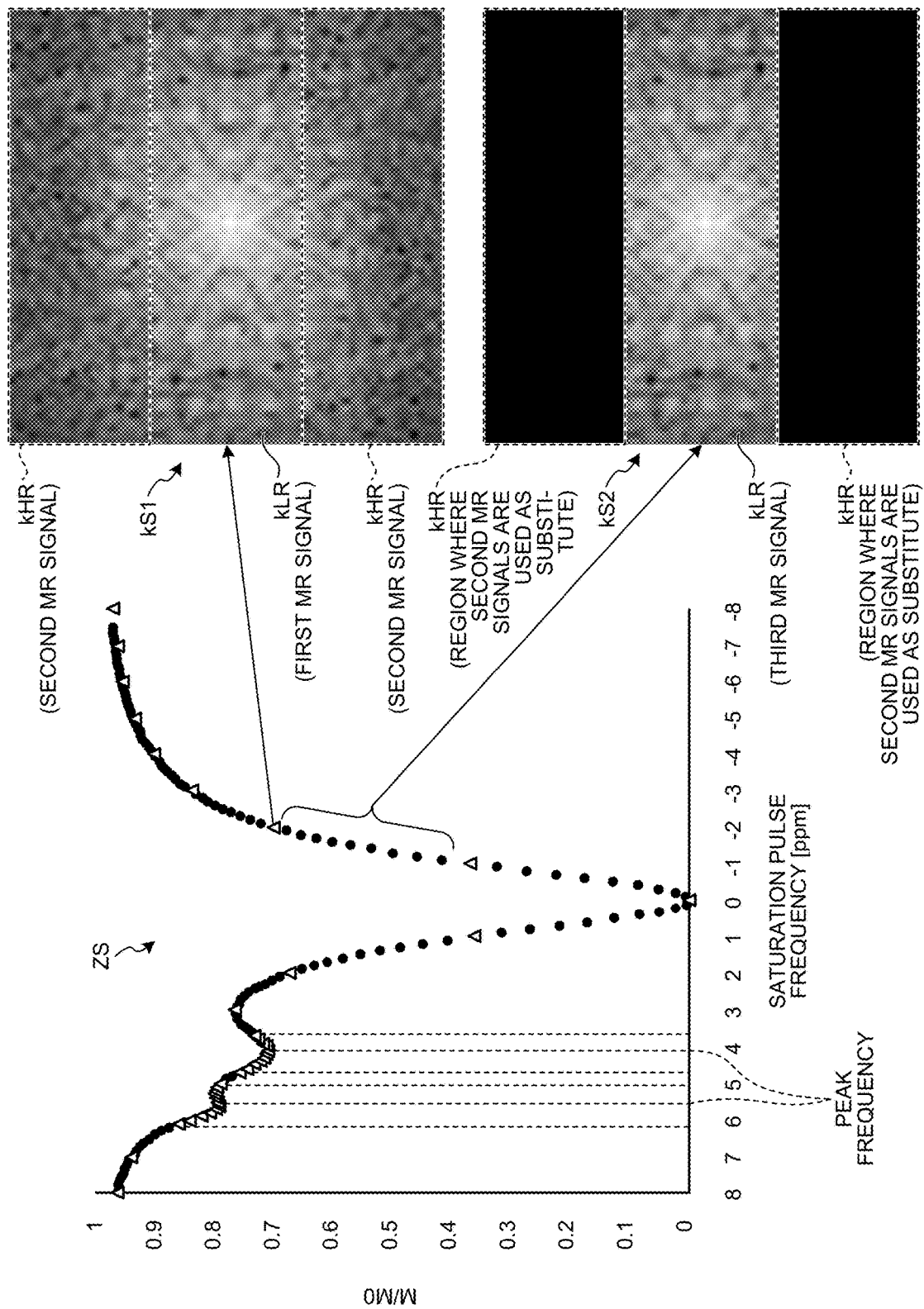
FIG. 10 schematically illustrates an outline of a shortened CEST imaging process in the third modification of the embodiments, when an agent with physical properties affecting CEST exhibits two peak frequencies.

FIG. 10 schematically illustrates an outline of the shortened CEST imaging process when an agent with physical properties which affect the CEST exhibits two peak frequencies. Iopamidol is described as an example of the agent with two peak frequencies as illustrated in FIG. 10. In the Z-spectrum graph ZS of FIG. 10, the triangular symbols represent signal ratios relative to saturation pulse frequencies in the first sequence while the circular symbols represent signal ratios relative to saturation pulse frequencies in the second sequence. As illustrated in FIG. 10, the two peak frequencies appear at the bottoms of downward curves on the Z-spectrum graph ZS and are 4.2 ppm and 5.6 ppm according to literature data.

In this regard, the processing circuitry 150 uses the setting function 134 to set frequencies included in predetermined ranges (e.g., ±0.5 ppm) around the peak frequencies as a saturation pulse condition for the first sequence, as illustrated in FIG. 10. The frequencies are, for example, from 3.7 ppm to 4.8 ppm and from 5.1 ppm to 6.2 ppm by increments of 0.1 ppm. The predetermined ranges are not limited to the above ranges and can be optionally set via the input device 141. The rest of the saturation pulse frequencies are similar or the same as in the embodiments.

As described above, the MRI apparatus 100 of the third modification of the embodiments sets the frequencies included in the predetermined range centered around the peak frequency of the signal intensity due to the CEST effects as the saturation pulse condition for the first sequence. Further, the MRI apparatus 100 sets the peak frequency of the signal intensity due to the CEST effects, in accordance with agents having physical properties which have an influence on the CEST effects. According to the third modification, it is thus possible to acquire MR signals in the frequency range including the peak frequency for the entire k-space, thereby improving the S/N ratios of the first MR images in the vicinity of the peak frequency. As a result, the MRI apparatus 100 of the third modification can improve the accuracy of the Z-spectrum in the vicinity of the peak frequency, in addition to exerting the effects of the embodiments.

Fourth Modification

A fourth modification differs from the embodiments in setting a low frequency region based on the length of a region of interest set in a positioning image, which is to be used for positioning at the time of CEST imaging. That is, the process of the fourth modification is performed before the shortened CEST imaging process.

Prior to performing the first sequence and the second sequence, i.e., the shortened CEST imaging process, the sequence control circuitry 120 performs a positioning sequence for determining the position of a region of interest. The region of interest can be an imaging range. The sequence control circuitry 120 performs the positioning sequence to acquire corresponding MR signals (hereinafter, referred to as positioning MR signals).

The processing circuitry 150 uses the image generation function 138 to generate an MR image from the positioning MR signals (hereinafter, referred to as positioning image). The processing circuitry 150 uses the control function 133 to display the positioning image on the display 143.

The input device 141 receives a user's instruction as to a region of interest in the positioning image displayed on the display 143. The input device 141 receives an input of a length of the region of interest in the positioning image displayed on the display 143. The length of the region of interest corresponds to the length of an object to be imaged, the length or width of the region of interest, or the length of a structure in an object to be imaged.

The processing circuitry 150 uses the setting function 134 to set the region of interest and the length thereof in the positioning image. The setting function 134 sets a low frequency region based on the length of the region of interest. Specifically, with reference to the origin of the k-space, the setting function 134 sets an inverse of the length of the region of interest as the width of the low frequency region (hereinafter, low frequency width) in the direction of phase encoding in the k-space.

Figure 11:
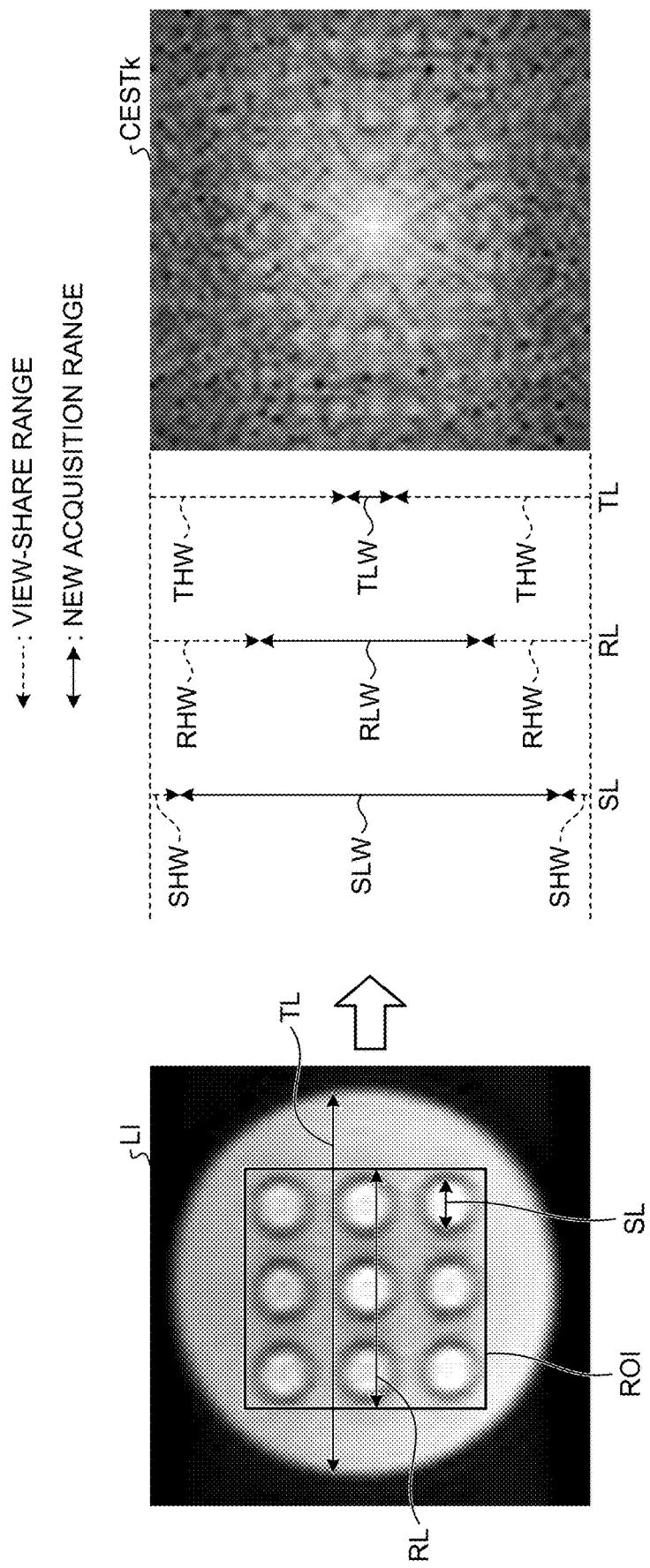
FIG. 11 illustrates a relationship between a positioning image with a length of a region of interest set and a low frequency width of a k-space related to a first sequence and a second sequence according to a fourth modification of the embodiments.

FIG. 11 illustrates an exemplary relationship between a positioning image LI having the length of a region of interest set thereto and the low frequency width of a k-space CESTk related to the first sequence and the second sequence. In response to an input of a length TL of an object to be imaged on the positioning image LI, as illustrated in FIG. 11, the setting function 134 sets an inverse of the length TL of the object to be imaged as a low frequency width TLW with reference to the origin of the k-space CESTk. In the k-space related to the second sequence, high frequency regions THW in which the second MR signals are used as a substitute have a width as illustrated in FIG. 11.

In response to an input of a length RL of a region of interest ROI on the positioning image LI, as illustrated in FIG. 11, the setting function 134 sets an inverse of the length RL of the object to be imaged as a low frequency width RLW with reference to the origin of the k-space CESTk. In the k-space related to the second sequence, high frequency regions RHW in which the second MR signals are used as a substitute has a width as illustrated in FIG. 11.

In response to an input of a length SL of a structure in the object to be imaged on the positioning image LI, as illustrated in FIG. 11, the setting function 134 sets an inverse of the length SL of the structure as a low frequency width SLW with reference to the origin of the k-space CESTk. In the k-space related to the second sequence, high frequency regions SHW in which the second MR signals are used as a substitute have a width as illustrated in FIG. 11.

As described above, the MRI apparatus 100 of the fourth modification of the embodiments performs the positioning sequence for determining the position of the region of interest ROI before performing the first sequence and the second sequence, and generates the positioning image from the MR signals acquired by the positioning sequence. The MRI apparatus 100 then sets the length of the region of interest ROI in the positioning image to set the low frequency region based on the length of the region of interest ROI. According to the fourth modification, in response to a user's desired input, the MRI apparatus 100 can set the low frequency region (non-view-share portion including no substitute MR signals) in which contrast components are dominant in the frequency space and the high frequency region (view-share portion including substitute MR signals) in which contrast components are non-dominant in the frequency space, in accordance with the length of an object to be imaged, a region of interest ROI, or a structure in the positioning image LI. Thereby, the MRI apparatus 100 is able to set the low frequency region in accordance with a user's region of interest and improve the Z-spectrum in accuracy.

Fifth Modification

A fifth modification differs from the embodiments in setting the low frequency regions with regard to the first sequence and the second sequence in accordance with a duration between two adjacent saturation pulses (i.e., repetition time or time to repeat (TR)) in CEST imaging. Specifically, the setting function 134 sets a low frequency region in accordance with a time interval (TR) between timings at which two adjacent saturation pulses among multiple saturation pulses are applied. That is, the setting function 134 sets the low frequency region in accordance with a length of a data acquisition period within the time interval between two saturation-pulse application timings.

Figure 12:
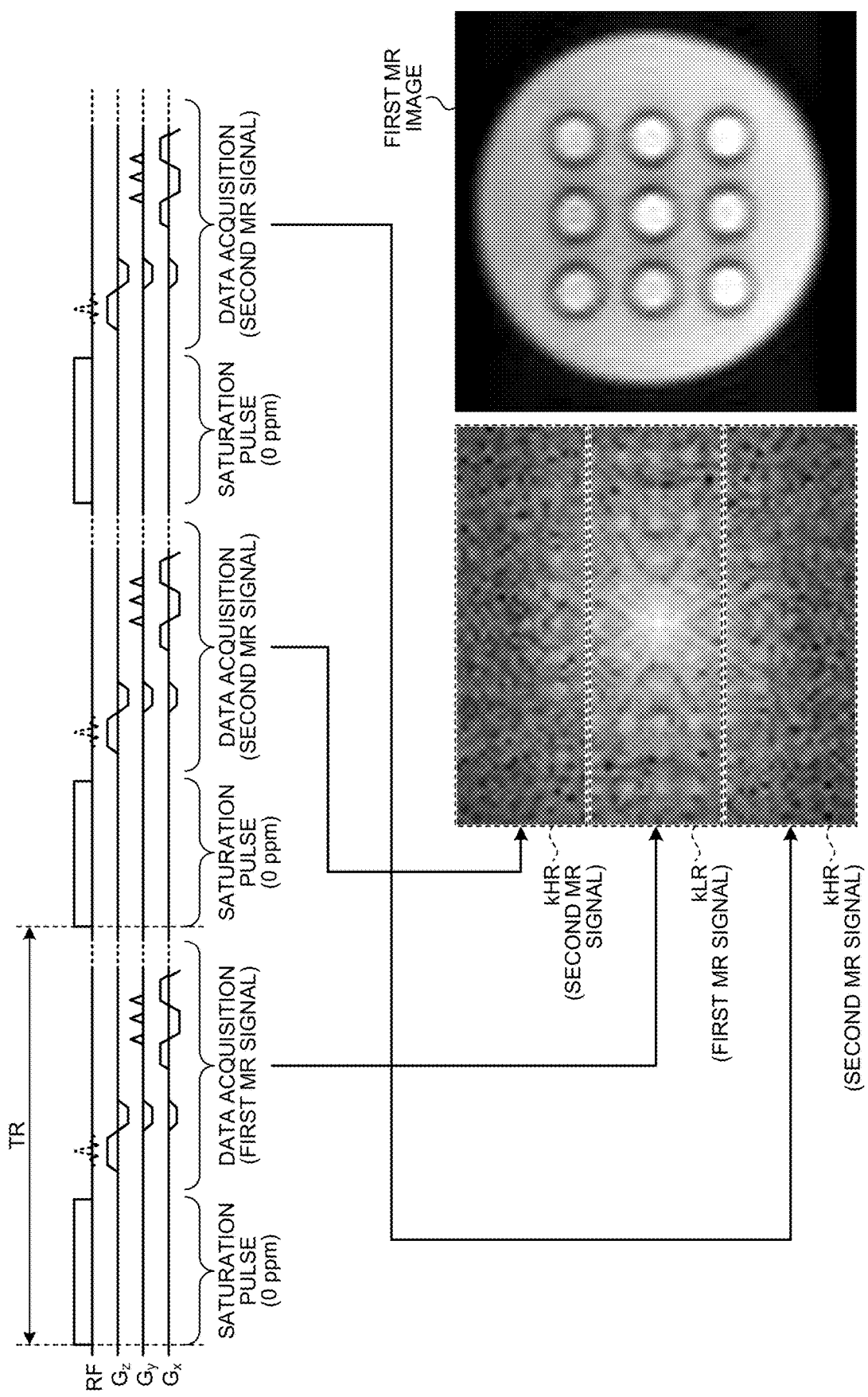
FIG. 12 illustrates an exemplary first sequence when the saturation pulses are at a center frequency of zero ppm in a fifth modification of the embodiments.

FIG. 12 illustrates an exemplary first sequence when saturation pulses are at the center frequency (zero ppm). As illustrated in FIG. 12, through the first sequence the entire k-space is filled with MR signals by application of RF pulses three times (three shots). In this case the low frequency region kLR of the k-space is filled with the first MR signals while the high frequency regions kHR of the k-space are filled with the second MR signals. The second MR signals having filled the high frequency regions kHR of the k-space are used as a substitute to fill the high frequency regions of the k-space related to the second sequence.

As illustrated in FIG. 12, the saturation pulses at the frequency zero ppm are applied before data acquisition. The saturation pulse interval or TR is preset based on a desirable enhanced image of an intended object at a longitudinal relaxation time T1, as illustrated in FIG. 12. Because of this, the size of the low frequency region kLR that allows acquisition of the first MR image is determined by an imaging method (e.g., fast spin echo method or gradient method) at the time of data acquisition by the first sequence. Specifically, the setting function 134 sets, as the low frequency region, the low frequency region of an imageable k-space in the time interval between timings at which two adjacent saturation pulses are applied. The fifth modification can attain same or similar effects as the embodiments, therefore, a description thereof is omitted.

Sixth Modification

Figure 13:
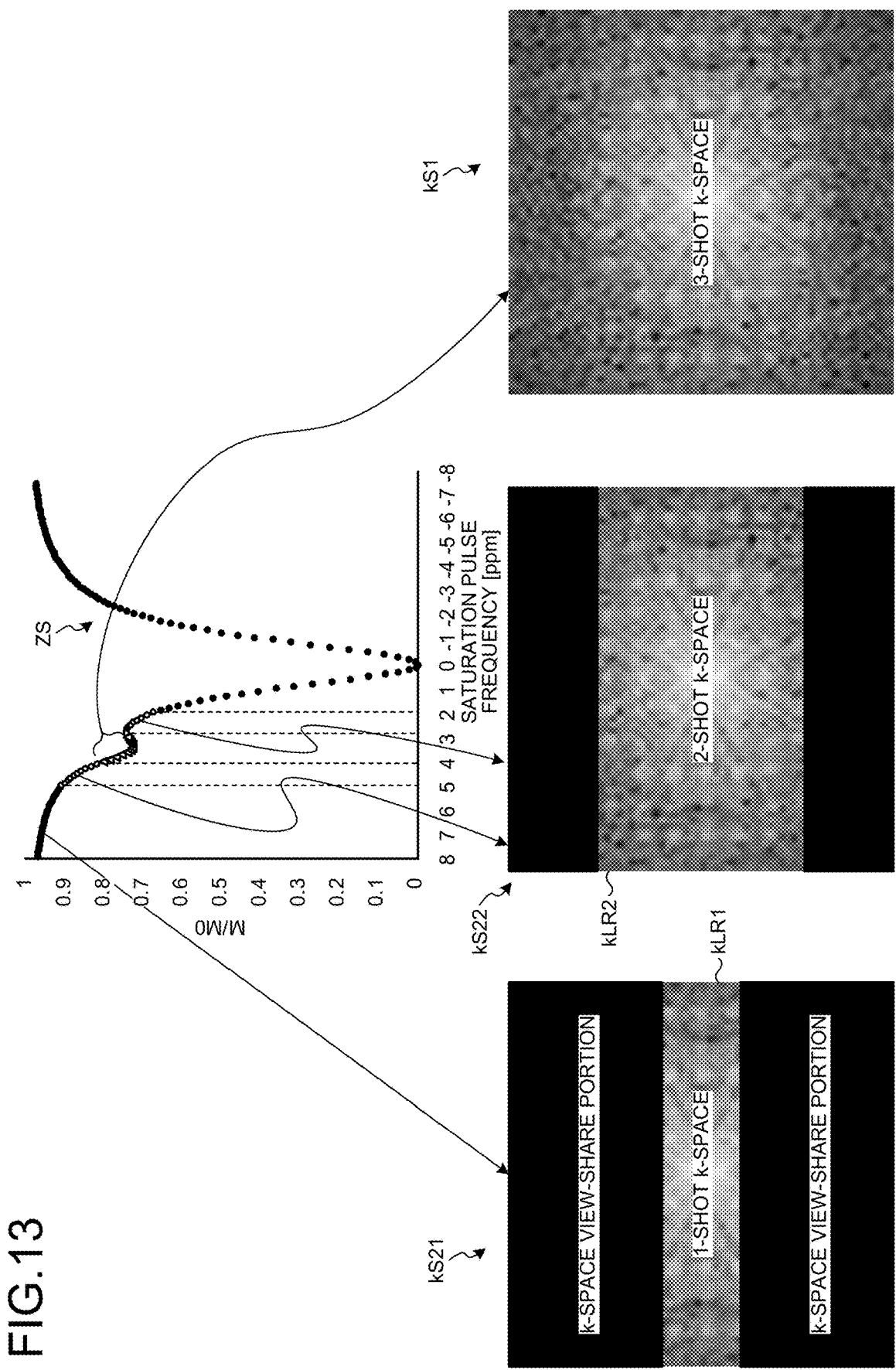
FIG. 13 schematically illustrates an outline of a shortened CEST imaging process in a six modification of the embodiments, taking amide groups as an example of agents to cause chemical exchange of protons present in a region of interest.

A sixth modification differs from the embodiments in setting the low frequency region by the second sequence such that as the saturation pulse frequency approaches at least one of the center frequency and the peak frequency, the low frequency region is enlarged. FIG. 13 schematically illustrates an outline of the shortened CEST imaging process, taking amide groups as an exemplary agent causing chemical exchange of protons present in a region of interest. In the Z-spectrum graph ZS of FIG. 13, the triangular symbols represent signal ratios relative to saturation pulse frequencies in the first sequence while the circular symbols of different sizes represent signal ratios relative to saturation pulse frequencies in the second sequence.

As illustrated in FIG. 13, the saturation pulse condition for the first sequence is set as in the third and fifth modifications. As an example, the setting function 134 sets frequencies included in a predetermined range (e.g., ±0.5 ppm) around the peak frequency (3.5 ppm) as a saturation pulse condition for the first sequence, as illustrated in FIG. 13. The frequencies are, for example, from 3.0 ppm to 4.0 ppm by increments of 0.1 ppm. The predetermined range is not limited to the above range and can be optionally set via the input device 141. As illustrated in FIG. 13, a k-space kS1 related to the first sequence is filled with the first MR signals and the second MR signals acquired by three-shot RF pulses.

With respect to the saturation pulse frequencies indicated by the smaller-size circular symbols apart by a predetermined frequency or more from both ends (e.g., 3.0 ppm and 4.0 ppm) of the saturation pulse frequencies of the first sequence, as illustrated in FIG. 13, a low frequency region kLR1 by the second sequence is set as a region acquirable by application of a single-shot RF pulse, as in the fifth modification, for example. Herein, the predetermined frequency is defined as 1 ppm, for example. The low frequency region of the k-space kS21 related to the second sequence is filled with the third MR signals while the high frequency regions (k-space view-share portions) of the k-space kS21 are filled with the substitute second MR signals.

The setting function 134 sets the low frequency region by the second sequence such that as the saturation pulse frequency approaches at least one of the center frequency and the peak frequency, the low frequency region is enlarged. Specifically, in saturation pulse frequency ranges (e.g., 2.0 ppm to 3.0 ppm and 4.0 ppm to 5.0 ppm in FIG. 13) corresponding to predetermined frequencies, the setting function 134 sets a low frequency region kLR2 of a k-space kS22 as a region acquirable by two-shot RF pulses, as illustrated in FIG. 13. In other words, the setting function 134 sets the low frequency region such that the high frequency regions, i.e., k-space view-share portions are decreased in size as the saturation pulse frequencies of the second sequence approach at least one of the center frequency and the peak frequency. As a result, the imaging time can be shortened in CEST imaging. The sixth modification attains same or similar effects as the embodiments, the first modification, and the third modification, therefore, a description thereof is omitted.

Seventh Modification

A seventh modification corresponds to an exemplary application of the six modification. The features of the seventh modification are in increasing the filling factor of the high frequency regions to be imaged by the second sequence as the saturation pulse frequencies of the first sequence are further away from both ends of an applied frequency range.

Figure 14:
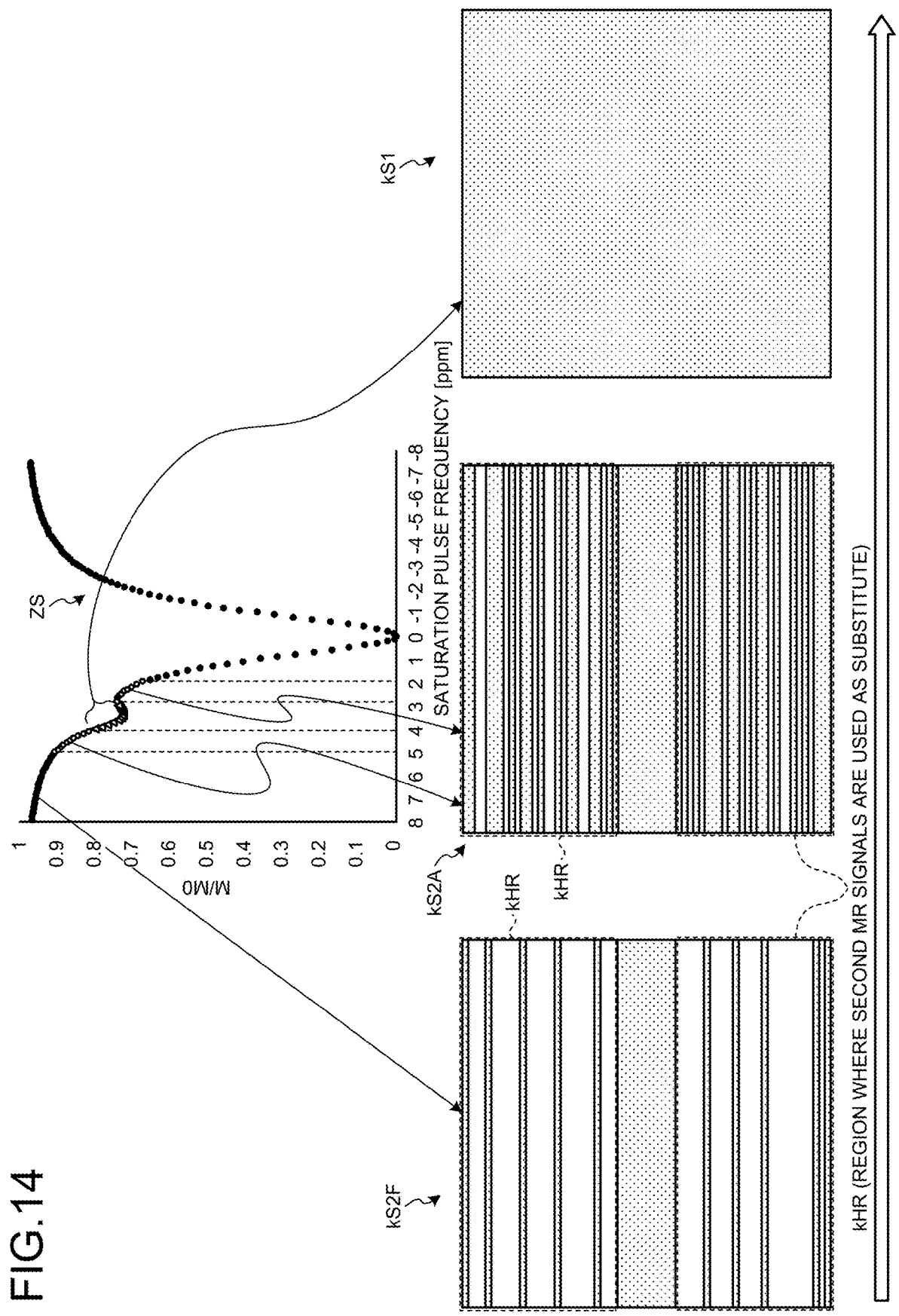
FIG. 14 schematically illustrates an outline of a shortened CEST imaging process in a seventh modification of the embodiments, taking amide groups as an example of agents to cause chemical exchange of protons present in a region of interest.

FIG. 14 schematically illustrates an outline of the shortened CEST imaging process, taking amide groups as an exemplary agent causing chemical exchange of protons present in a region of interest. In the Z-spectrum graph ZS of FIG. 14, the triangular symbols represent signal ratios relative to saturation pulse frequencies in the first sequence while the circular symbols of different sizes represent signal ratios relative to saturation pulse frequencies in the second sequence. The saturation pulse condition for the first sequence is set as in the six modification, therefore, a description thereof is omitted.

As illustrated in FIG. 14, as the saturation pulse frequencies of the second sequence are further away from both ends of the saturation pulse frequencies (e.g., 3.0 ppm and 4.0 ppm) of the first sequence, the filling factor (=1−undersampling acquisition factor) of an existing fast imaging method (e.g., compressed sensing) in the high frequency regions kHR is decreased from a k-space kS2A to a k-space kS2F related to the second sequence. The existing fast imaging method is not limited to compressed sensing and may be parallel imaging, for example. In other words, as the saturation pulse frequencies approach a saturation pulse frequency of interest (e.g., ppm of the peak frequency), new filling factors of k-spaces kS2F, kS2A, and kS1 are increased toward 100% in this order, as indicated by the arrow at the bottom of FIG. 13. This results in decreasing the ratio of substitute k-space data (second MR signals) by the first sequence relative to the region where no MR signals are acquired in the high frequency regions by the second sequence.

The setting function 134 sets partial regions in the high frequency regions kHR by the second sequence such that as the saturation pulse frequencies approach at least one of the center frequency and the peak frequency, the proportion (filling factor) of the partial regions is increased in the high frequency regions kHR from the k-space kS2F to the k-space kS2A. That is, the setting function 134 changes the filling factor of the k-space through the second sequence depending on how far (distance represented by frequencies) the saturation pulse frequencies are from the saturation pulse frequency of interest to decrease the proportion of the substitute second MR signals from the first sequence in the k-space related to the second sequence in accordance with the degree of farness. This can shorten the imaging time in CEST imaging.

The sequence control circuitry 120 further acquires fourth MR signals for the partial regions by the second sequence.

That is, by the second sequence of the seventh modification, the fourth MR signals for the partial regions of the high frequency regions are acquired in addition to the third MR signals for the low frequency region. In other words, the second sequence of the seventh modification is a sequence for implementing acquisition of the MR signals for the low frequency region and part of the high frequency regions. In this case, the partial regions are increased in density to increase the filling factor of the high frequency regions with the fourth MR signals, as the saturation pulse frequencies of the second sequence approach at least one of the center frequency and the peak frequency, as illustrated in FIG. 14. In other words, the setting function 134 changes the filling factor of the high frequency regions with the fourth MR signals depending on how far the saturation pulse frequencies are away from at least one of the center frequency and the peak frequency. The setting function 134 thus changes the number of partial regions depending on the position of the saturation pulse frequency.

The assigning function 136 assigns the fourth MR signals to the partial regions of the high frequency regions. The assigning function 136 assigns the corresponding second MR signals to other regions different from the partial regions having the fourth MR signals assigned thereto. The seventh modification attains same or similar effects as the embodiments and the six modification, therefore, a description thereof is omitted.

Eighth Modification

The features of an eighth modification are in setting, with respect to a plurality of second sequences with different saturation pulse frequencies, partial regions in the high frequency regions of the k-spaces in a complimentary manner, and assigning the fourth MR signals corresponding to one partial region to another region different from the one partial region in a complimentary manner. The partial regions of the high frequency regions may have, for example, any sparsity. The sparsity of the partial region corresponds to sparsity in compressed sensing.

With respect to a plurality of second sequences with different saturation pulse frequencies, the setting function 134 sets partial regions in the high frequency regions of the k-spaces in a complimentary manner. The partial region corresponds to a region in which the fourth MR signals are acquired by the second sequence. In the respective second sequences, the setting function 134 sets the partial regions with sparsity so that the regions where no MR signals are acquired can be mutually complimented among the k-spaces related to different second sequences.

The sequence control circuitry 120 further acquires the fourth MR signals corresponding to the partial regions by the second sequences. The sequence control circuitry 120 thus acquires the third MR signals and the fourth MR signals through the second sequences.

In the eighth modification, thus, one (hereinafter, referred to as a reference sequence) of the second sequences with different saturation pulse frequencies is related to a reference saturation pulse frequency. The reference sequence is for acquiring the fourth MR signals corresponding to the partial regions of the high frequency regions in addition to the third MR signals. Another one of the second sequences is related to frequencies around the reference saturation pulse frequency and is for acquiring the fourth MR signals corresponding to another region to be complimentary to the partial regions of the high frequency regions by the reference sequence, in addition to the third MR signals.

The assigning function 136 complimentarily assigns the fourth MR signals corresponding to the partial regions by the second sequences to other regions than the partial regions in the high frequency regions by the second sequences. Specifically, the assigning function 136 assigns the fourth MR signals, which are acquired for another partial region by the second sequence based on a similar saturation pulse condition (frequencies), to another region concerned of the high frequency region in the k-space related to each of the second sequences. In this manner the assigning function 136 assigns the fourth MR signals acquired by other second sequences with different saturation pulse frequencies to other regions in the k-spaces related to the respective second sequences.

Figure 15:
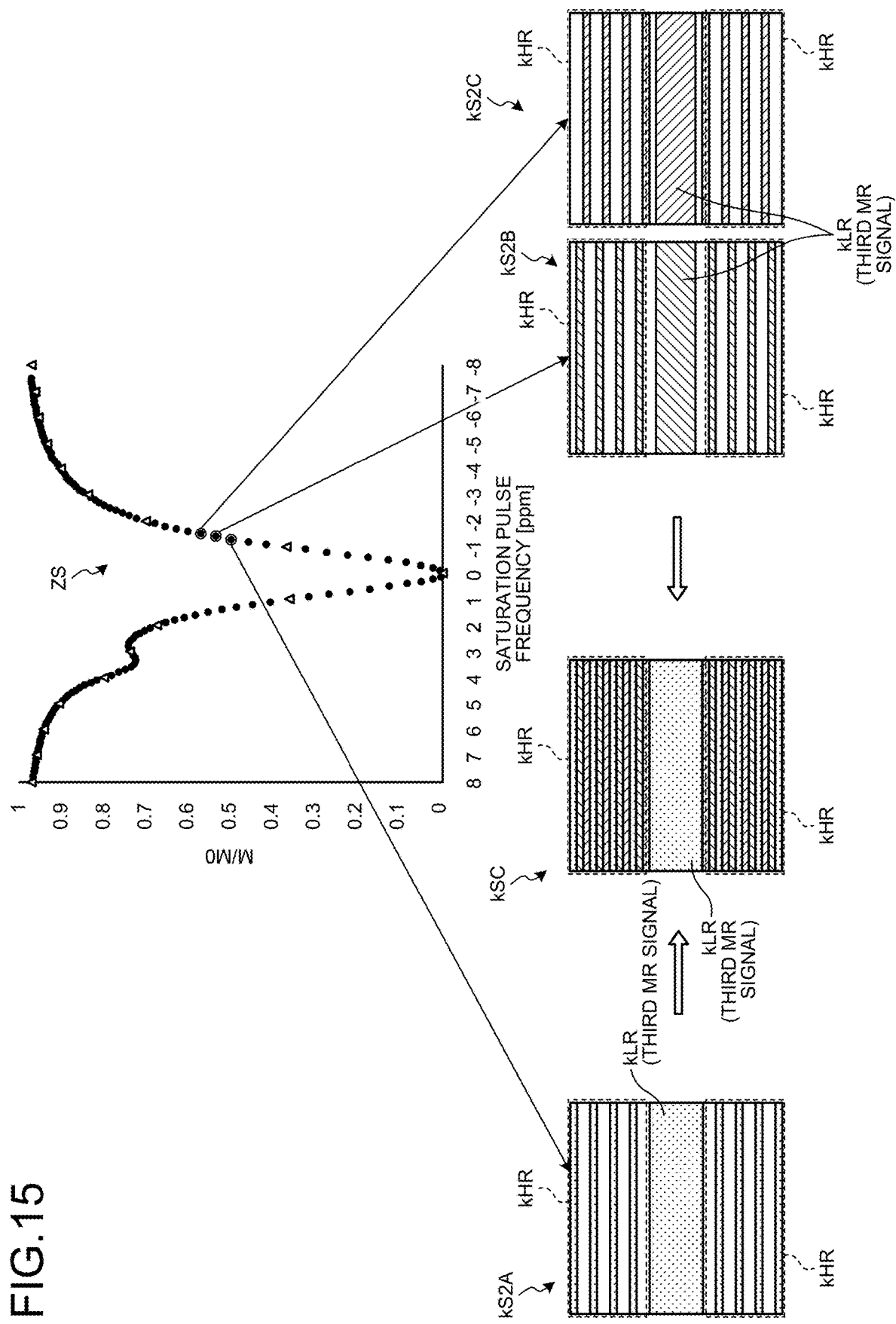
FIG. 15 schematically illustrates an outline of a shortened CEST imaging process in an eighth modification of the embodiments.

FIG. 15 schematically illustrates an outline of the shortened CEST imaging process. In the following the shortened CEST imaging process is described in detail with reference to FIG. 15. In the Z-spectrum graph ZS of FIG. 15, the triangular symbols represent signal ratios relative to saturation pulse frequencies in the first sequence while the circular symbols represent signal ratios relative to saturation pulse frequencies in the second sequences. The first sequence illustrated in FIG. 15 is similar or the same as in FIG. 5 of the embodiments, therefore, a description thereof is omitted.

As illustrated in FIG. 15, by the second sequences the MR signals (third MR signals) corresponding to the low frequency regions kLR of the k-spaces are acquired. In addition the MR signals (fourth MR signals) are acquired for the partial regions with preset sparsity in the high frequency regions kHR by each of the second sequences, as illustrated in FIG. 15. Thus, the fourth MR signals are acquired for the partial regions including profile components (high frequency regions) by one second sequence, and shared by or used as a substitute in the partial regions of the k-space related to another second sequence having different saturation pulse frequencies.

Specifically, the fourth MR signals are acquired so that the high frequency regions kHR of the k-spaces (kS2A, kS2B, kS2C) related to three second sequences with different saturation pulse frequencies have different degrees of sparsity, as illustrated in FIG. 15. Referring to the k-space kS2A as one of the three k-spaces, the fourth MR signals, acquired under a condition approximate to the saturation pulse condition (frequency, ppm) of the second sequence for the k-space kS2A, are assigned to other regions of the high frequency regions kHR in the k-space kS2A for which no MR signals are acquired.

As such, with respect to the k-space for the reference sequence, the assigning function 136 assigns the third MR signals to the low frequency region and the fourth MR signals corresponding to the partial regions to the high frequency regions, as illustrated in FIG. 15. In addition the assigning function 136 assigns, to the partial regions, the fourth MR signals corresponding to another region complimentary to the partial regions in a complimentary manner.

In more detail, as illustrated in FIG. 15, the other regions of the high frequency regions kHR in the k-space kS2A are interpolated with the fourth MR signals in the high frequency regions kHR of the k-space kS2B and the fourth MR signals in the high frequency regions kHR of the k-space kS2C. In this manner, the assigning function 136 generates a k-space kSC by interpolating the high frequency regions kHR of the k-space kS2A with the fourth MR signals by other second sequences. The effects of the eighth modification are similar or the same as the embodiments, therefore, a description thereof is omitted.

To implement the technical ideas of the embodiments by an imaging-time shortening method, the imaging-time shortening method includes performing a first sequence and a second sequence under different saturation pulse conditions in chemical exchange saturation transfer (CEST) imaging in which a plurality of saturation pulses is applied to acquire a plurality of magnetic resonance signals responsive to the plurality of saturation pulses, the first sequence being for acquiring first magnetic resonance signals corresponding to a low frequency region of a k-space and second magnetic resonance signals corresponding to a high frequency region of the k-space, the second sequence being for acquiring third magnetic resonance signals corresponding to at least the low frequency region; and assigning the third magnetic resonance signals and the second magnetic resonance signals to a single k-space generated for the second sequence. The procedure and effects of the shortened CEST imaging process to be executed by the imaging-time shortening method are similar or the same as those in the embodiments, a description thereof is omitted.

According to at least one of the embodiments and modifications as described above, it is made possible to shorten the length of imaging time in CEST imaging.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

With respect to the embodiments and modifications as above, the following subjoinders describing an aspect and selective features of the inventions will be presented.

Subjoinder 1

A magnetic resonance imaging apparatus includes sequence control circuitry configured to perform a first sequence and a second sequence under different saturation pulse conditions in chemical exchange saturation transfer "CEST" imaging in which a plurality of saturation pulses is applied to acquire a plurality of magnetic resonance signals responsive to the plurality of saturation pulses, the first sequence being for acquiring first magnetic resonance signals corresponding to a first frequency region of a k-space and second magnetic resonance signals corresponding to a second frequency region of the k-space, the second sequence being for acquiring third magnetic resonance signals corresponding to at least the first frequency region; and processing circuitry configured to assign the third magnetic resonance signals and the second magnetic resonance signals to a single k-space generated for the second sequence, wherein frequency including the first frequency region is lower than frequency including the second frequency region.

Subjoinder 2

The processing circuitry may set, as a saturation pulse condition for the first sequence, a free-water resonance frequency based on a predetermined static field strength and frequencies offset from the free-water resonance frequency at a predetermined frequency interval, and may set frequencies located between the offset frequencies as a saturation pulse condition for the second sequence. The sequence control circuitry may perform the first sequence and the second sequence according to the set saturation pulse conditions.

Subjoinder 3

The processing circuitry may set, as a saturation pulse condition for the first sequence, a free-water resonance frequency based on a predetermined static field strength and frequencies included in a predetermined range around the free-water resonance frequency, and may set frequencies outside the predetermined range as a saturation pulse condition for the second sequence.

Subjoinder 4

The sequence control circuitry may perform the first sequence while shifting a frequency of the saturation pulses from a free-water resonance frequency based on a predetermined static field strength, until a magnetic resonance image generated from the first magnetic resonance signals and the second magnetic resonance signals exhibits signal intensity of a minimum value. The processing circuitry may set, as a saturation pulse condition for the first sequence, frequencies offset from a frequency corresponding to the minimum value at a predetermined frequency interval and frequencies included in a predetermined range centered around the frequency corresponding to the minimum value, and may set frequencies located between the frequencies as a saturation pulse condition for the second sequence. The sequence control circuitry may perform the first sequence and the second sequence until completion of applying the plurality of saturation pulses at the frequencies in the respective saturation pulse conditions.

Subjoinder 5

The processing circuitry may set, as a saturation pulse condition for the first sequence, frequencies included in a predetermined range centered around a frequency corresponding to a peak of signal intensity due to CEST effect.

Subjoinder 6

The processing circuitry may set the frequency corresponding to the peak of signal intensity due to the CEST effect, in accordance with an agent having physical properties which have an influence on the CEST effect.

Subjoinder 7

The processing circuitry may set, in the k-space, as the first frequency region, a region including a center of the k-space and included in a predetermined range from the center.

Subjoinder 8

The sequence control circuitry may perform a positioning sequence for determining a position of a region of interest, before performing the first sequence and the second sequence. The processing circuitry may set a length of the region of interest in a positioning image generated from magnetic resonance signals acquired by the positioning sequence, and may set the first frequency region based on the length of the region of interest.

Subjoinder 9

The processing circuitry may set the first frequency region in accordance with a time interval between timings at which two adjacent saturation pulses among the plurality of saturation pulses are applied.

Subjoinder 10

The processing circuitry may set the first frequency region by the second sequence such that the first frequency region is enlarged as a frequency of the saturation pulses approaches at least one of a free-water resonance frequency based on a static field strength and a frequency corresponding to a peak of signal intensity due to CEST effect.

Subjoinder 11

By the second sequence, fourth magnetic resonance signals corresponding to a partial region of the second frequency region may be acquired in addition to the third magnetic resonance signals corresponding to the first frequency region. The processing circuitry may assign, in the second frequency region, the corresponding second magnetic resonance signals to another region different from the partial region to which the fourth magnetic resonance signals are assigned.

Subjoinder 12

The partial region may be increased in density to increase a filling factor of the k-space as a frequency of the saturation pulses approaches at least one of a free-water resonance frequency based on a static field strength and a frequency corresponding to a peak of signal intensity due to CEST effect. The filling factor corresponds to a proportion of the partial region in the second frequency region by the second sequence.

Subjoinder 13

The second sequence may include a plurality of second sequences with different saturation pulse frequencies. Of the plurality of second sequences, a second sequence with a reference saturation pulse frequency may be for acquiring fourth magnetic resonance signals corresponding to a partial region of the second frequency region in addition to acquiring the third magnetic resonance signals corresponding to the first frequency region. Of the plurality of second sequences, a second sequence with frequencies centered around the reference saturation pulse frequency may be for acquiring fourth magnetic resonance signals corresponding to another region complementary to the partial region of the second frequency region, in addition to acquiring the third magnetic resonance signals corresponding to the first frequency region. The processing circuitry may complimentarily assign the fourth magnetic resonance signals corresponding to the partial region and the fourth magnetic resonance signals corresponding to the another region to the second frequency region of a k-space related to the second sequence with the reference saturation pulse frequency, and may assign the third magnetic resonance signals to the first frequency region of the k-space related to the second sequence with the reference saturation pulse frequency.

Subjoinder 14

An imaging-time shortening method includes performing a first sequence and a second sequence under different saturation pulse conditions in chemical exchange saturation transfer "CEST" imaging in which a plurality of saturation pulses is applied to acquire a plurality of magnetic resonance signals responsive to the plurality of saturation pulses, the first sequence being for acquiring first magnetic resonance signals corresponding to a first frequency region of a k-space and second magnetic resonance signals corresponding to a second frequency region of the k-space, the second sequence being for acquiring third magnetic resonance signals corresponding to at least the first frequency region; and assigning the third magnetic resonance signals and the second magnetic resonance signals to a single k-space generated for the second sequence, wherein frequency including the first frequency region is lower than frequency including the second frequency region.

What is claimed is:

1. A magnetic resonance imaging apparatus, comprising:
  processing circuitry configured to:
    set, as a saturation pulse condition for a first sequence in a chemical exchange saturation transfer "CEST" imaging in which a plurality of saturation pulses is applied to acquire a plurality of magnetic resonance "MR" signals responsive to the plurality of saturation pulses, a free-water resonance frequency based on a predetermined static field strength and frequencies offset from the free-water resonance frequency at a predetermined frequency interval, and
    set frequencies located between the offset frequencies as a saturation pulse condition for a second sequence in the CEST imaging; and
  sequence control circuitry configured to perform the first sequence and the second sequence under the different saturation pulse conditions in the CEST imaging, the first sequence being configured to acquire first MR signals corresponding to a first frequency region of a k-space and second MR signals corresponding to a second frequency region of the k-space, the second sequence configured to acquire third MR signals corresponding to at least the first frequency region, and the first frequency region being lower in frequency than the second frequency region,
  wherein the processing circuitry is further configured to:
    assign the third MR signals and the second MR signals to a single k-space generated for the second sequence such that the low frequency region of the k-space related to the second sequence is filled with the third MR signals while the high frequency region of the k-space related to the second sequence is filled with the second MR signals,
    generate multiple MR images, each MR image of the multiple MR images corresponding to the saturation pulse frequencies of the second sequence from the second MR signals and the third MR signals assigned to the single k-space, and
    control a display to display the multiple MR images.

2. A magnetic resonance imaging apparatus, comprising:
  sequence control circuitry configured to perform a first sequence and a second sequence under different saturation pulse conditions in a chemical exchange saturation transfer "CEST" imaging in which a plurality of saturation pulses is applied to acquire a plurality of magnetic resonance "MR" signals responsive to the plurality of saturation pulses, the first sequence being configured to acquire first MR signals corresponding to a first frequency region of a k-space and second MR signals corresponding to a second frequency region of the k-space, the second sequence being configured to acquire third MR signals corresponding to at least the first frequency region, the first frequency region being lower in frequency the second frequency region; and processing circuitry configured to assign the third MR signals and the second MR signals to a single k-space generated for the second sequence, wherein the sequence control circuitry is further configured to perform the first sequence while shifting a frequency of the saturation pulses from a free-water resonance frequency based on a predetermined static field strength, until an MR image generated from the first MR signals and the second MR signals exhibits signal intensity of a minimum value, the processing circuitry is further configured to:
  set, as a saturation pulse condition for the first sequence, frequencies offset from a frequency corresponding to the minimum value at a predetermined frequency interval and frequencies included in a predetermined range centered around the frequency corresponding to the minimum value, and
  set frequencies located among the set frequencies as a saturation pulse condition for the second sequence, the sequence control circuitry is further configured to perform the first sequence and the second sequence until completion of applying the plurality of saturation pulses at the frequencies in the respective saturation pulse conditions, and the processing circuitry is further configured to:
  generate multiple MR images, corresponding to the saturation pulse frequencies of the second sequence from the second MR signals and the third MR signals assigned to the single k-space, and
  control a display to display the multiple MR images.

3. An imaging-time shortening method comprising:
  setting, as a saturation pulse condition for a first sequence in a chemical exchange saturation transfer "CEST" imaging in which a plurality of saturation pulses is applied to acquire a plurality of magnetic resonance "MR" signals responsive to the plurality of saturation pulses, a free-water resonance frequency based on a predetermined static field strength and frequencies offset from the free-water resonance frequency at a predetermined frequency interval;
  setting frequencies located between the offset frequencies as a saturation pulse condition for a second sequence in the CEST imaging;
  performing the first sequence and the second sequence under the different saturation pulse conditions in the CEST imaging configured to acquire first MR signals corresponding to a first frequency region of a k-space and second MR signals corresponding to a second frequency region of the k-space, the second sequence configured to acquire third MR signals corresponding to at least the first frequency region, and the first frequency region being lower in frequency than the second frequency region; and
  assigning the third MR signals and the second MR signals to a single k-space generated for the second sequence such that the low frequency region of the k-space related to the second sequence is filled with the third MR signals while the high frequency region of the k-space related to the second sequence is filled with the second MR signals;
  generating multiple MR images, each MR image of the multiple MR images corresponding to the saturation pulse frequencies of the second sequence from the second MR signals and the third MR signals assigned to the single k-space; and
  controlling a display to display the multiple MR images.

4. The magnetic resonance imaging apparatus according to claim 1, wherein the processing circuitry is further configured to:
  set, as the saturation pulse condition for the first sequence, a free-water resonance frequency based on a predetermined static field strength and frequencies included in a predetermined range around the free-water resonance frequency, and
  set frequencies outside the predetermined range as the saturation pulse condition for the second sequence.

5. The magnetic resonance imaging apparatus according to claim 1, wherein the processing circuitry is further configured to set, as the saturation pulse condition for the first sequence, frequencies included in a predetermined range centered around a frequency corresponding to a peak of signal intensity due to CEST effect.

6. The magnetic resonance imaging apparatus according to claim 5, wherein the processing circuitry is further configured to set the frequency corresponding to the peak of signal intensity due to the CEST effect in accordance with an agent having physical properties which have an influence on the CEST effect.

7. The magnetic resonance imaging apparatus according to claim 1, wherein the processing circuitry is further configured to set, in the k-space, as the first frequency region, a region including a center of the k-space and included in a predetermined range from the center.

8. The magnetic resonance imaging apparatus according to claim 7, wherein
  the sequence control circuitry is further configured to perform a positioning sequence for determining a position of a region of interest, before performing the first sequence and the second sequence, and
  the processing circuitry is further configured to:
    set a length of the region of interest in a positioning image generated from MR signals acquired by the positioning sequence, and
    set the first frequency region based on the length of the region of interest.

9. The magnetic resonance imaging apparatus according to claim 1, wherein the processing circuitry is further configured to set the first frequency region in accordance with a time interval between timings at which two adjacent saturation pulses among the plurality of saturation pulses are applied.

10. The magnetic resonance imaging apparatus according to claim 1, wherein the processing circuitry is further configured to set the first frequency region by the second sequence such that the first frequency region is enlarged as a frequency of the saturation pulses approaches at least one of a free-water resonance frequency based on a static field strength and a frequency corresponding to a peak of signal intensity due to CEST effect.

11. The magnetic resonance imaging apparatus according to claim 1, wherein
  by the second sequence, fourth MR signals corresponding to a partial region of the second frequency region are acquired in addition to the third MR signals corresponding to the first frequency region,
  the processing circuitry is further configured to assign, in the second frequency region, corresponding second MR signals to another region different from the partial region to which the fourth MR signals are assigned.

12. The magnetic resonance imaging apparatus according to claim 11, wherein the partial region is increased in density to increase a filling factor of the k-space as a frequency of the saturation pulses approaches at least one of a free-water resonance frequency based on a static field strength and a frequency corresponding to a peak of signal intensity due to CEST effect, the filling factor corresponding to a proportion of the partial region in the second frequency region by the second sequence.

13. The magnetic resonance imaging apparatus according to claim 1, wherein
   the second sequence includes a plurality of second sequences with different saturation pulse frequencies,
   of the plurality of second sequences, a second sequence with a reference saturation pulse frequency is for acquiring fourth MR signals corresponding to a partial region of the second frequency region in addition to acquiring the third MR signals corresponding to the first frequency region, and
   of the plurality of second sequences, a second sequence with frequencies centered around the reference saturation pulse frequency is for acquiring fourth MR signals corresponding to another region complementary to the partial region of the second frequency region, in addition to acquiring the third MR signals corresponding to the first frequency region,
   the processing circuitry is further configured to:
      complimentarily assign the fourth MR signals corresponding to the partial region and the fourth MR signals corresponding to the other region to the second frequency region of a k-space related to the second sequence with the reference saturation pulse frequency, and
      assign the third MR signals to the first frequency region of the k-space related to the second sequence with the reference saturation pulse frequency.

\* \* \* \* \*